(12) United States Patent
Franca-Neto et al.

(10) Patent No.: US 10,254,982 B2
(45) Date of Patent: Apr. 9, 2019

(54) SYSTEM AND METHODOLOGY FOR LOW LATENCY ERROR MANAGEMENT WITHIN A SHARED NON-VOLATILE MEMORY ARCHITECTURE

(71) Applicant: Western Digital Technologies, Inc., Irvine, CA (US)

(72) Inventors: Luiz M. Franca-Neto, Sunnyvale, CA (US); Robert Eugeniu Mateescu, San Jose, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 15/428,745

(22) Filed: Feb. 9, 2017

(65) Prior Publication Data

US 2018/0129434 A1 May 10, 2018

Related U.S. Application Data

(63) Continuation-in-part of application No. 15/396,238, filed on Dec. 30, 2016.

(Continued)

(51) Int. Cl.
*G06F 11/00* (2006.01)
*G06F 3/06* (2006.01)
(Continued)

(52) U.S. Cl.
CPC .......... *G06F 3/0619* (2013.01); *G06F 3/0629* (2013.01); *G06F 3/0655* (2013.01);
(Continued)

(58) Field of Classification Search
CPC .... G06F 3/0619; G06F 3/0629; G06F 3/0655; G06F 11/08; G11C 15/046
See application file for complete search history.

(56) References Cited

U.S. PATENT DOCUMENTS 6,618,281 B1 * 9/2003 Gordon ............... G06F 11/1064
365/189.07
6,978,343 B1 12/2005 Ichiriu
(Continued)

OTHER PUBLICATIONS

Kong et al, "Low-Complexity Low-Latency Architecture for Matching of Data Encoded With Hard Systematic Error-Correcting Codes" abstract, IEEE Transactions on Very Large Scale Integration (VLSI) Systems, vol. 22, Issue: 7, Jul. 2014; published Aug. 20, 2013; pp. 1648-1652; http://ieeexplore.ieee.org/document/6583335/.

(Continued)

*Primary Examiner* — Esaw T Abraham
(74) *Attorney, Agent, or Firm* — Loza & Loza, LLP; Gabriel Fitch

(57) ABSTRACT

Various aspects directed towards facilitating error management within a shared non-volatile memory (NVM) architecture are disclosed. Data is stored in an NVM array, and error correction vector (ECV) information associated with the NVM array is stored in a content addressable memory (CAM). A parallel query of the NVM array and the CAM is then performed, which includes a query of the NVM array that yields a readout of the NVM array, and a query of the CAM that yields an ECV corresponding to the readout of the NVM array.

20 Claims, 22 Drawing Sheets

Related U.S. Application Data

(60) Provisional application No. 62/420,501, filed on Nov. 10, 2016.

(51) Int. Cl.
  *G11C 15/04* (2006.01)
  *G06F 11/08* (2006.01)
  *G11C 11/00* (2006.01)

(52) U.S. Cl.
  CPC ............ *G06F 3/0679* (2013.01); *G06F 11/08* (2013.01); *G11C 15/046* (2013.01); *G11C 11/005* (2013.01)

(56) References Cited

U.S. PATENT DOCUMENTS

| | | | | |
|---|---|---|---|---|
| 7,237,156 | B1 * | 6/2007 | Srinivasan | G11C 15/00 365/49.15 |
| 7,809,998 | B1 * | 10/2010 | Sutardja | G06F 11/1008 365/201 |
| 7,962,806 | B2 | 6/2011 | Kotrla | H04L 43/50 714/704 |
| 8,266,498 | B2 * | 9/2012 | Moyer | G06F 11/1064 714/758 |
| 8,443,133 | B2 * | 5/2013 | Yano | G06F 11/1471 711/103 |
| 8,446,645 | B2 * | 5/2013 | Okada | H04N 1/00588 358/462 |
| 8,587,978 | B2 * | 11/2013 | Lee | G11C 15/00 365/200 |
| 8,621,326 | B2 * | 12/2013 | Uchibori | G06F 11/1064 365/201 |
| 8,634,248 | B1 | 1/2014 | Sprouse et al. | |
| 8,839,053 | B2 | 9/2014 | Schechter et al. | |
| 9,130,597 | B2 | 9/2015 | Cooke | |
| 9,225,356 | B2 | 12/2015 | Mu et al. | |
| 9,257,184 | B2 | 2/2016 | Rao | |
| 9,280,421 | B2 | 3/2016 | Nazarian et al. | |
| 9,311,183 | B2 * | 4/2016 | Fitzpatrick | G06F 11/1068 |
| 9,323,602 | B2 * | 4/2016 | Hoekstra | G06F 11/1048 |
| 2003/0217321 | A1 * | 11/2003 | Hsu | G11C 15/04 714/763 |
| 2012/0179942 | A1 * | 7/2012 | Nagadomi | G06F 11/008 714/718 |
| 2015/0121166 | A1 | 4/2015 | Goodman et al. | |

OTHER PUBLICATIONS

Hoffman et al, "Wear-out analysis of error correction techniques in phase-change memory", http://dl.acm.org/.citation.cfm?id=2616606.2616647; 2 pages.

Pagiamtzis et al, "A Soft-Error Tolerant Content-Addressable Memory (CAM) Using an Error-Correcting-Match Scheme", http://ieeexplore.ieee.org/stamp/stamp.jsp?tp=&arnumber=4114964&isnumber=4114894; 3 pages.

Pellizzer et al, "Reliability characterization of Phase Change Memory", https://www.researchgate.net/publication/237352531_Reliability_characterization_of_Phase_Change_Memory; 6 pages.

Luiz Franca-Neto U.S. Appl. No. 15/011,538, filed Jan. 30, 2016, 31 pages.

Luiz Franca-Neto U.S. Appl. No. 15/011,539, filed Jan. 30, 2016, 43 pages.

* cited by examiner

FIG. 1
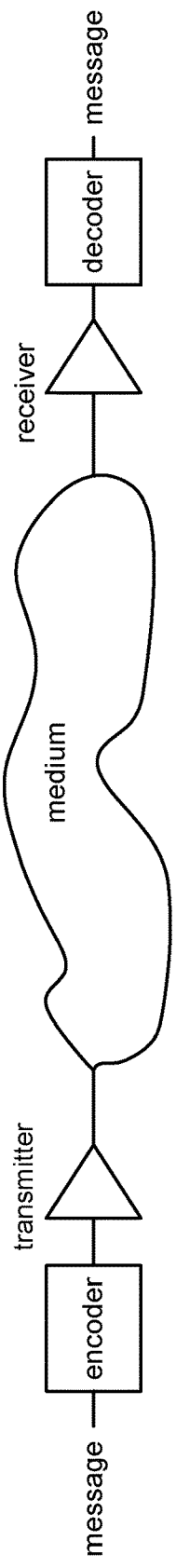
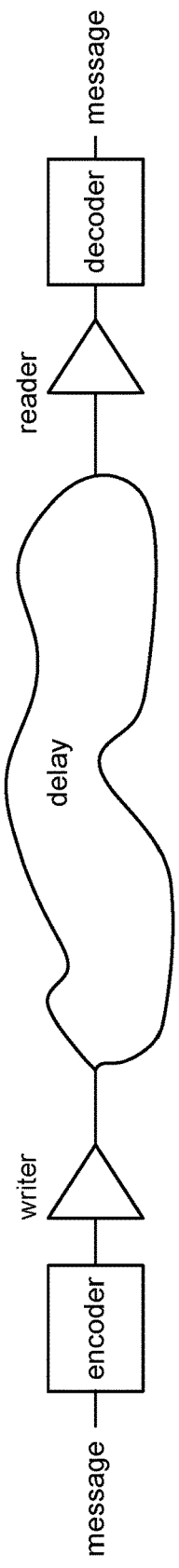
A communication channel challenge: error inflicted in message flight from transmitter to receiver
Storage: writing and reading data as a communication channel with a delay

FIG. 15 EXEMPLARY CAM DESIGN EMBODIMENT: PARALLEL OPERATION IN DATA READOUT

CAM alternative 3: single shot, towards 3ns latency

>> multi-page protection overhead: 30% area impact
>> no latency added in zero error
>> ~ 3 clock cycles mostly hidden by the parallel operation of NVM data readout and CAM readout

SYSTEM AND METHODOLOGY FOR LOW LATENCY ERROR MANAGEMENT WITHIN A SHARED NON-VOLATILE MEMORY ARCHITECTURE

CROSS-REFERENCE TO RELATED APPLICATIONS

This application is a continuation-in-part of U.S. patent application Ser. No. 15/396,238, filed Dec. 30, 2016, entitled "SYSTEM AND METHODOLOGY THAT FACILITATES ERROR MANAGEMENT WITHIN A SHARED NON-VOLATILE MEMORY ARCHITECTURE," which claims the benefit of U.S. Provisional Patent Application Ser. No. 62/420,501, filed Nov. 10, 2016, entitled "SYSTEM AND METHODOLOGY THAT FACILITATES ERROR MANAGEMENT WITHIN A SHARED NON-VOLATILE MEMORY ARCHITECTURE," wherein the entire contents of each application are incorporated herein by reference.

TECHNICAL FIELD

The subject disclosure generally relates to non-volatile memory (NVM), and more specifically to a system and methodology for error management within a shared NVM architecture.

BACKGROUND

Conventional cloud computing systems use various components that are generally known in the art. For instance, such systems typically include an assembly of servers with processors, memory, etc. in which standard buses and input/output (I/O) controllers are typically deployed. Recent trends favor larger memory provisioning for database, in-memory-processing, and low latency system responses. It is desired that non-volatile memory (NVM) technology may someday support low latency applications (200 nanoseconds (ns) to 400 ns readouts), which may be used in Storage Class Memory (SCM) solutions, and/or, in multiprocessor systems, where NVM may be used as shared-memory. Relative to Dynamic Random Access Memory (DRAM), however, conventional NVM systems, such as Phase Change Memory (PCM), Resistive Random Access Memory (ReRAM), and Magnetoresistive Random Access Memory (MRAM), have several limitations. For instance, conventional NVM systems (a) are orders of magnitude more energy demanding than DRAM to write a bit; (b) have finite endurance as opposed to the virtually infinite endurance of DRAM; and (c) have an undesirable error rate immediately after fabrication (e.g., raw Bit Error Rate (BER) of NVM systems are approximately 1E-5 or 1E-6, whereas "error-free" operation would require an Uncorrectable Bit Error Rate (UBER)<1E-18).

Accordingly, it would be desirable to provide a system and method which overcomes these limitations. To this end, it should be noted that the above-described deficiencies are merely intended to provide an overview of some of the problems of conventional systems, and are not intended to be exhaustive. Other problems with the state of the art and corresponding benefits of some of the various non-limiting embodiments may become further apparent upon review of the following detailed description.

SUMMARY

A simplified summary is provided herein to help enable a basic or general understanding of various aspects of exemplary, non-limiting embodiments that follow in the more detailed description and the accompanying drawings. This summary is not intended, however, as an extensive or exhaustive overview. Instead, the sole purpose of this summary is to present some concepts related to some exemplary non-limiting embodiments in a simplified form as a prelude to the more detailed description of the various embodiments that follow.

In accordance with one or more embodiments and corresponding disclosure, various non-limiting aspects are described in connection with error management within a shared non-volatile memory (NVM) architecture. In one such aspect, a method is provided which includes storing data in an NVM array, and storing error correction vector (ECV) information associated with the NVM array in a content addressable memory (CAM). The method further includes performing a parallel query of the NVM array and the CAM. For this embodiment, the parallel query includes a query of the NVM array that yields a readout of the NVM array, and a query of the CAM that yields an ECV corresponding to the readout of the NVM array.

In another aspect, a system is provided, which includes a processing unit configured to control various components including, an NVM, a CAM, and a query component. Within such embodiment, the NVM is configured to store data in an NVM array, whereas the CAM is configured to store ECV information associated with the NVM array, and the query component is configured to perform a parallel query of the NVM array and the CAM. Here, the parallel query includes a query of the NVM array that yields a readout of the NVM array, and a query of the CAM that yields an ECV corresponding to the readout of the NVM array.

In a further aspect, an apparatus is provided. For this particular embodiment, the apparatus includes means for storing data in an NVM array, and means for storing ECV information associated with the NVM array in a CAM. The apparatus further includes means for performing a parallel query of the NVM array and the CAM. For this embodiment, the parallel query includes a query of the NVM array that yields a readout of the NVM array, and a query of the CAM that yields an ECV corresponding to the readout of the NVM array.

Other embodiments and various non-limiting examples, scenarios, and implementations are described in more detail below.

BRIEF DESCRIPTION OF THE DRAWINGS

Various non-limiting embodiments are further described with reference to the accompanying drawings in which:

FIG. 1 is a diagram illustrating various low latency error correction challenges addressed by the aspects disclosed herein;

DETAILED DESCRIPTION

Overview

Figure 2:
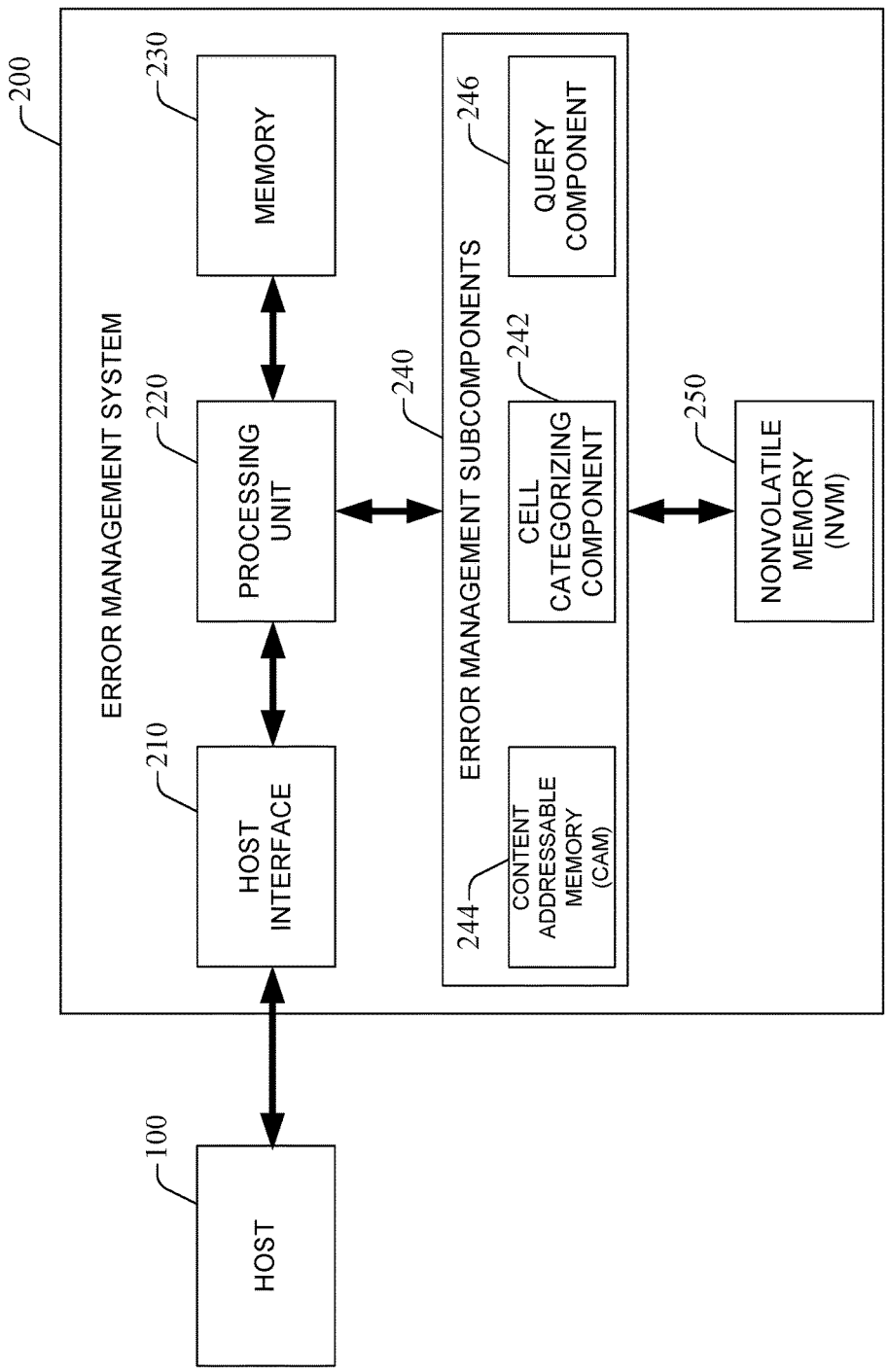
FIG. 2 is a block diagram of an exemplary system for a parallel query error management scheme in accordance with an aspect of the subject specification.

As discussed in the background, it is desirable to provide a system and method which overcomes the various limitations of conventional non-volatile memory (NVM) systems and NVM technology. The embodiments disclosed herein are directed towards overcoming such limitations by providing various error management schemes that may be implemented within a shared NVM architecture. For instance, in a particular embodiment, a low latency error correction scheme is disclosed in which error correction is performed in parallel with a readout of NVM cells. Moreover, a low latency readout error correction method and apparatus is disclosed, which makes error-prone NVM operate as error-free DRAM-like devices.

To better illustrate the desirability of such embodiments, a brief summary of limitations associated with conventional NVM systems is provided. First, although memory-like applications require a native BER of less than 1E-15, conventional NVM technologies provide a Bit Error Rate (BER) of approximately 1E-3 after approximately 20 million cycles. Also, in order to provide "error free" operation for an NVM system in which a 64-bit memory bus bursting 4 times implies a 32 B dataset, the BER of approximately 1E-3 needs to be improved to UBER<1E-18. It should be further noted that encoding for such a small dataset of 32 Bytes (32 B) requires an overhead of larger than 30%, whereas larger datasets would require smaller overheads, but are undesirable for memory applications. Also, at readout time, the latency associated with reading data from the NVM array and the latency associated with decoding a 32 B dataset are in series, which results in a total latency of approximately twice the readout latency since the decoder latency is added to the readout latency.

To overcome these limitations, a content addressable memory (CAM)-based approach is disclosed, wherein queries to an NVM array and a CAM that stores error correction data associated with the NVM array are performed in parallel. (See e.g., FIG. 8). Namely, aspects are disclosed in which latencies from readout data (i.e., data obtained from the NVM array via a read operation) occur in parallel to the latencies associated with the construction of an Error Correcting Vector (ECV), wherein the ECV construction latency is hidden by the readout latency resulting in an ultimate low latency "error free" operation of NVM as memory. Here, with respect to ECV construction, it is contemplated that an ECV for a particular bit is a CAM entry, which includes any of various types of information that may be used to correct a potential error in that bit. To this end, it should be appreciated that information from the CAM may be used to to 1) allow some bits from the data read from the NVM array to pass through (those are correct bits), and 2) block bits at positions the CAM deems are bits in error. But, since each line in the CAM may also be configured to include the correct bit information (See e.g., FIG. 8), this correct bit may be inserted in place of the corresponding bit which was blocked. Since more than one error might have been reported in the CAM for a given address in the NVM data array, more than one line might be read from the CAM, and more than one bit from the NVM data might be blocked and their corresponding correct bit inserted using information from the CAM.

In a particular embodiment, redundancy is also decoupled to protect against errors stemming from a 32 B dataset size. Within such embodiment, redundancy represented by the CAM is shared by one to several 4000 Byte (4 kB) pages, which provides a low overhead design, while maintaining a fine granularity of 32 B in write/read operations.

Generally, there is a tradeoff between capacity and performance (i.e., low latency) in NVM systems. Here, it should be appreciated that write latency often depends on the NVM's cell physics, which may include: 1) charging/de-charging a float-gate by CHE in NOR Flash, by FN tunneling in NAND Flash; 2) crystallization/amorphization of GeSbTe in Phase-Change Memory; and 3) creating/dissolving a conductive filament in ReRAM. Read latency, however, primarily depends on the integrated circuit architecture (e.g., large RC delay in long chain of cells to bitline (NAND Flash) vs. short RC delay (cell close to bitline) in emerging NVM). It should also be noted that there is approximately 1E+3 times more diminishment in readout latency from capacity to performance NVM, and that it is anticipated that low latency NVM will scale further and be a lower cost than DRAM.

Referring next to FIG. 1, a diagram illustrating the low latency error correction challenges addressed by the aspects disclosed herein is provided. As illustrated, with respect to communication and storage, the decoder latency is in series with the readout latency, which results in the latencies being added. As previously stated, a parallel arrangement for data readout and error correction is contemplated to overcome this limitation, wherein the error correction latency is hidden behind the readout latency. It is further contemplated that such arrangement will be a low overhead solution with a data readout granularity as small as 32 B (i.e., 64-bit bus with 4 data bursts).

Exemplary Parallel Query Embodiments

Referring next to FIG. 2, a block diagram of an exemplary system for a parallel query error management scheme is provided in accordance with one embodiment of the disclosure. Within such embodiment, an error management system 200 is coupled to a host 100, as shown, wherein the error management system 200 may be implemented in any of various ways (e.g., a solid state drive, a hybrid drive, etc.). The host 100 provides commands to the error management system 200 for transferring data between the host 100 and the error management system 200. For example, the host 100 may provide a write command to the error management system 200 for writing data to the error management system 200, or a read command to the error management system 200 for reading data from the error management system 200. To this end, it is contemplated that the host 100 may be any system or device having a need for data storage or retrieval and a compatible interface for communicating with the error management system 200. For example, the host 100 may be a computing device, a personal computer, a portable computer, or workstation, a server, a personal digital assistant, a digital camera, a digital phone, or the like.

The error management system 200 includes a host interface 210, a processing unit 220, a memory 230, and a non-volatile memory (NVM) 250. The host interface 210 is coupled to the processing unit 220 and facilitates communication between the host 100 and the processing unit 220. Additionally, the processing unit 220 is coupled to the memory 230 and the NVM 250. The host interface 210 may be any type of communication interface, such as an Integrated Drive Electronics (IDE) interface, a Universal Serial Bus (USB) interface, a Serial Peripheral (SP) interface, an Advanced Technology Attachment (ATA) interface, a Small Computer System Interface (SCSI), an IEEE 1394 (Firewire) interface, or the like. In some embodiments, the host 100 includes the error management system 200. In other embodiments, the error management system 200 is remote with respect to the host 100 or is contained in a remote computing system coupled in communication with the host 100. For example, the host 100 may communicate with the error management system 200 through a wireless communication link.

The processing unit 220 controls operation of the error management system 200. In various embodiments, the processing unit 220 receives commands from the host 100 through the host interface 210 and performs the commands to transfer data between the host 100 and the NVM 250. The processing unit 220 may include any type of processing device, such as a microprocessor, a microcontroller, an embedded controller, a logic circuit, software, firmware, or the like, for controlling operation of the error management system 200.

In some embodiments, some or all of the functions described herein as being performed by the processing unit 220 may instead be performed by another element of the error management system 200. For example, the error management system 200 may include a microprocessor, a microcontroller, an embedded controller, a logic circuit, software, firmware, or any kind of processing device, for performing one or more of the functions described herein as being performed by the processing unit 220. In some embodiments, one or more of the functions described herein as being performed by the processing unit 220 are instead performed by the host 100. In some embodiments, some or all of the functions described herein as being performed by the processing unit 220 may instead be performed by another element such as a controller in a hybrid drive including both non-volatile memory elements and magnetic storage elements.

The memory 230 may be any memory, computing device, or system capable of storing data. For example, the memory 230 may be a random-access memory (RAM), a dynamic random-access memory (DRAM), a static random-access memory (SRAM), a synchronous dynamic random-access memory (SDRAM), a flash storage, an erasable programmable read-only-memory (EPROM), an electrically erasable programmable read-only-memory (EEPROM), or the like. In various embodiments, the processing unit 220 uses the memory 230, or a portion thereof, to store data during the transfer of data between the host 100 and the NVM 250. For example, the memory 230 or a portion of the memory 230 may be a cache memory.

The NVM 250 receives data from the processing unit 220 and stores the data. The NVM 250 may be any type of non-volatile memory, such as a flash storage system, a solid state drive, a flash memory card, a secure digital (SD) card, a universal serial bus (USB) memory device, a CompactFlash card, a SmartMedia device, a flash storage array, or the like.

In an aspect of the disclosure, it is contemplated that the processing unit 220 can be configured to implement the error management schemes disclosed herein on the NVM 250 by controlling various aspects of the error management subcomponents 240. As illustrated, the error management subcomponents 240 may include a cell categorizing component 242, a content addressable memory (CAM) 244, and a query component 246. Within such embodiment, the cell categorizing component 242 is configured to categorize NVM cells within the NVM 250 as limited-range programmable cells or full-range programmable cells, whereas the CAM 244 is configured to configured to store error correction vector (ECV) information associated with an NVM array associated with the NVM 250, and the query component 246 is configured to perform a parallel query of the NVM array and the CAM 244, wherein the parallel query includes a query of the NVM array that yields a readout of the NVM array and a query of the CAM 244 that yields a construction of an ECV corresponding to the readout of the NVM array.

Figure 3:
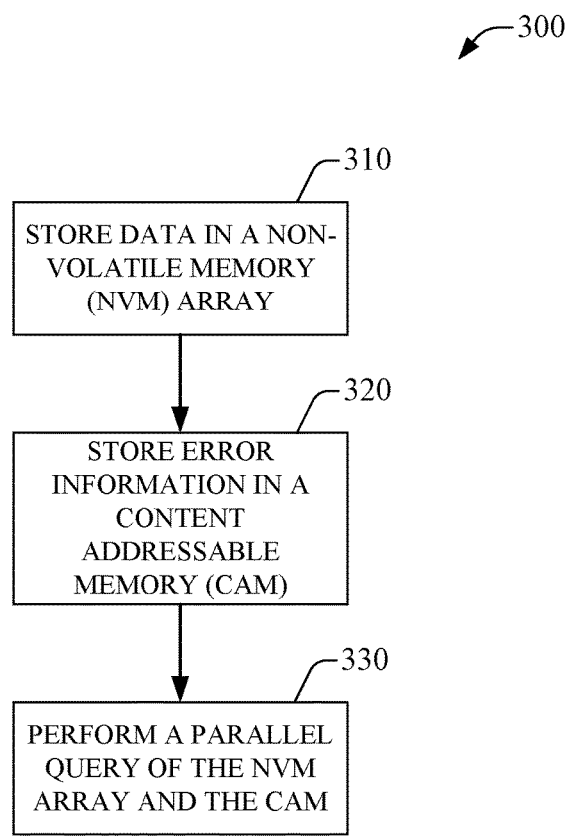
FIG. 3 is a flow diagram of an exemplary methodology for a parallel query error management scheme in accordance with an aspect of the subject specification.

Referring next to FIG. 3, a flow chart illustrating an exemplary method for implementing such a scheme according to an embodiment is provided. As illustrated, process 300 includes a series of acts that may be performed by an NVM system according to an aspect of the subject specification. For instance, process 300 may be implemented by employing a processor to execute computer executable instructions stored on a computer readable storage medium to implement the series of acts. In another embodiment, a computer-readable storage medium comprising code for causing at least one computer to implement the acts of process 300 is contemplated.

As illustrated, process 300 begins at act 310 with data being stored in an NVM array. ECV information associated with the NVM array is then stored in a CAM at act 320. Process 300 then concludes at act 330 with a parallel query of the NVM array and the CAM being performed. Here, it should be noted that the parallel query performed at act 330 includes a query of the NVM array that yields a readout of the NVM array and a query of the CAM that yields an ECV corresponding to the readout of the NVM array.

Figure 4:
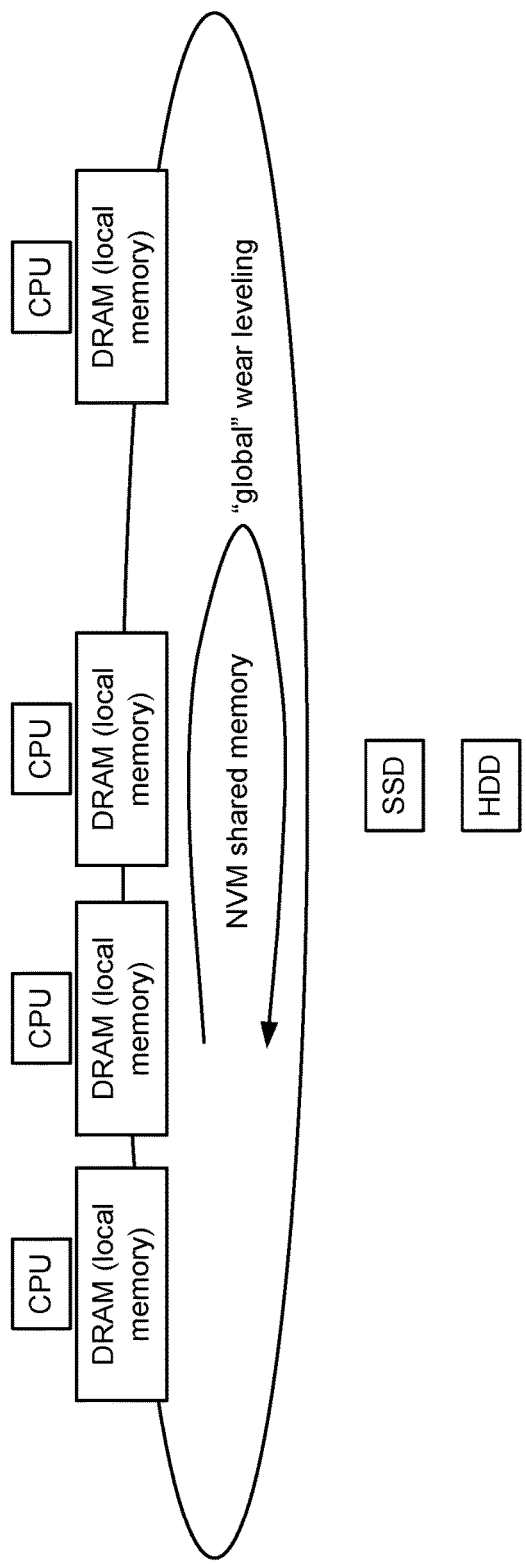
FIG. 4 illustrates an exemplary shared NVM architecture according to the subject specification.

In a further aspect of the disclosure, a shared NVM architecture is contemplated, which desirably fits the current multiprocessor paradigm, wherein the NVM 250 illustrated in FIG. 2 is a shared NVM controllable by each of a plurality of processors within processing unit 220. To this end, an exemplary shared NVM architecture according to the subject specification is provided in FIG. 4. Here, it should be appreciated that the shared NVM architecture disclosed herein is directed, in part, towards mitigating various limitations associated with NVM device physics, wherein no shared-memory computing paradigm is implied, and wherein there is no implication on cache coherence or memory consistency. It is noted that conventional NVM (e.g., PCM, ReRAM, MRAM, etc.) must scale better for it to be a viable lower cost substitution for DRAM, and that previous assessments in the industry regarding NVM permanence should be revisited within a context for low power operation.

Various strategies are thus contemplated for mitigating observed deficiencies of current NVM technology. For instance, as previously discussed, a CAM-based approach is contemplated to address the high BER rate of conventional NVM systems (i.e., 1E-6 to 1E-5 out of fab; and 1E-3 end of life). Namely, such CAM-based approach: 1) requires little additional overhead (i.e., <7%) in small granularity 32 B write/read; 2) facilitates ultimate low latency, wherein the CAM is queried in parallel with the NVM array, which hides the CAM latency behind the NVM readout latency; and 3) provides a basis for a two layer error management scheme in which the CAM fixes errors from limited-range programmable cells, and a light encoding may be used to protect against retention failures in full-range programmable cells.

Strategies are also contemplated to mitigate the high energy required to write in NVM (relative to DRAM) and for neutralizing the finite endurance of NVM systems. For instance, embodiments are disclosed in which wear leveling across threads, cores, and processors is contemplated (i.e., where the shared NVM is configured to facilitate a global wear leveling across a plurality of processors). Embodiments are also contemplated in which DRAM is used as a "last cache" in both single and multi-processor systems where NVM is added as shared memory. Such embodiments have yielded several desirable characteristics including, but not limited to: 1) a lower write activity resulting from the shared NVM subsystem; 2) a lower power consumption by the NVM subsystem, and 3) a longer time to wear resulting from the large size of the NVM subsystem.

Mitigation strategies directed towards remote memory access (RMA) are also contemplated. For instance, a novel low latency fabric for RMA is contemplated, which may include an all-connected point-to-point network of virtual wires.

Figure 5:
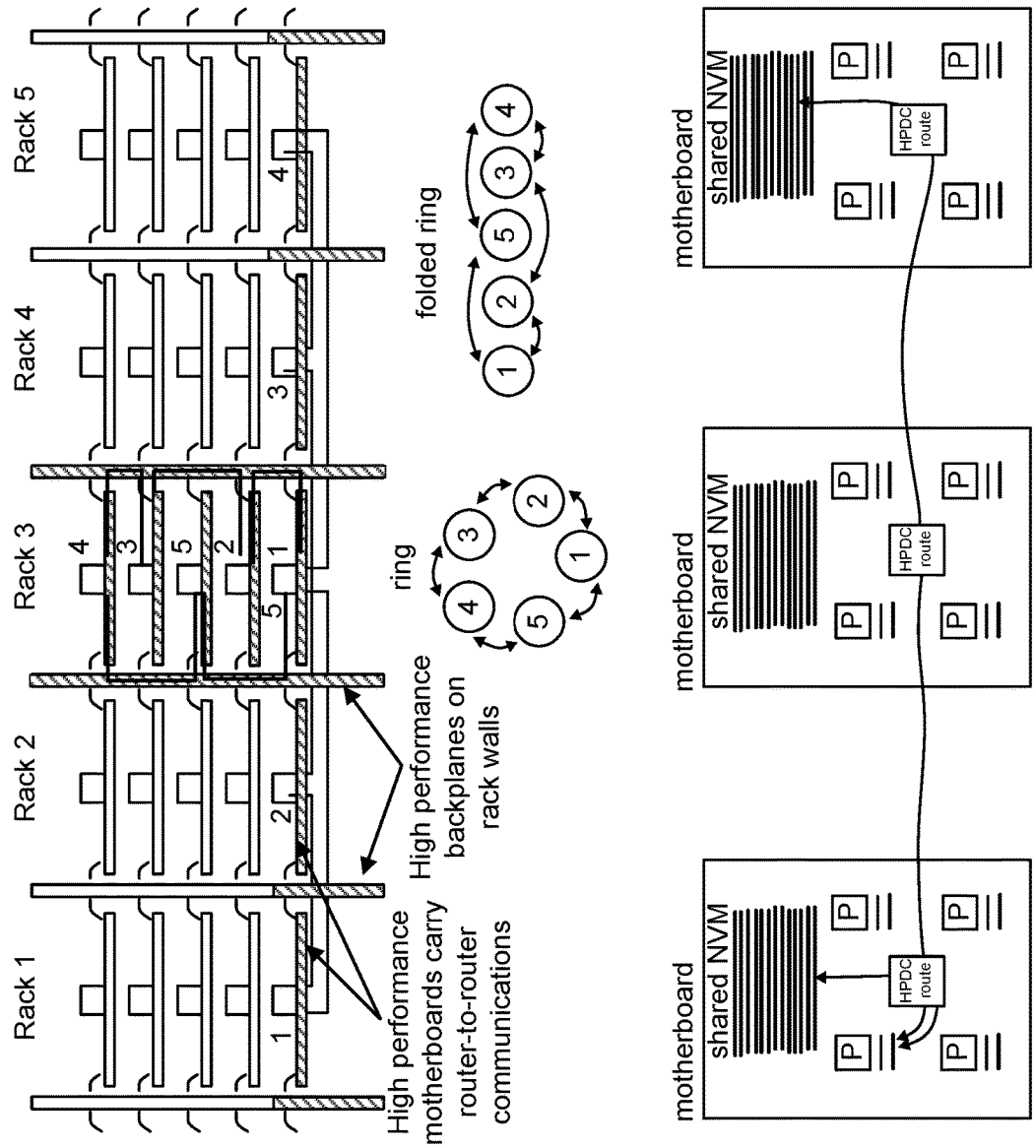
FIG. 5 illustrates an exemplary multiprocessor system with a shared NVM according to an aspect of the subject specification.

Referring next to FIG. 5, an exemplary multiprocessor system with a shared NVM in accordance with an embodiment is provided. As illustrated, it is contemplated that such a system includes high performance motherboards configured to carry router-to-router communications, and further includes high performance backplanes on rack walls. Various other components may also be used to facilitate the aspects disclosed herein including the components disclosed in U.S. patent application Ser. No. 15/011,538 and U.S. patent application Ser. No. 15/011,539, each of which are hereby incorporated by reference in their entirety.

Referring back to FIG. 2, it should be noted that the query component 246 may be configured to perform the aforementioned parallel query according to a readout latency of the NVM 250 and an ECV construction latency of the CAM 244. For instance, in a particular embodiment, the ECV construction latency of the CAM 244 is configured to be less than the readout latency of the NVM 250, wherein the query component 246 is configured to schedule the parallel query so that the ECV construction latency of the CAM 244 ends before the readout latency of the NVM 250.

In a further aspect of the disclosure, various configurations of the cell categorizing component 242 are also contemplated. For instance, it is contemplated that the cell categorizing component 242 may be configured to determine a range of programmability associated with each of a plurality of NVM cells within the NVM 250 when the plurality of NVM cells are programmed. Within such embodiment, it is further contemplated that the CAM 244 may be configured to limit storage of ECV information to information corresponding to NVM cells identified as limited-range programmable cells of the NVM 250.

With respect to how the cell categorizing component 242 determines the range of programmability of NVM cells, it should be noted that aspects disclosed herein are contemplated in light of physically-based insight ascertained about such cells. For instance, the cell categorizing component 242 may be configured to determine the range of programmability based on a first threshold voltage associated with programming a cell into a high resistance state and on a second threshold voltage associated with programming a cell into a low resistance state.

Figure 6:
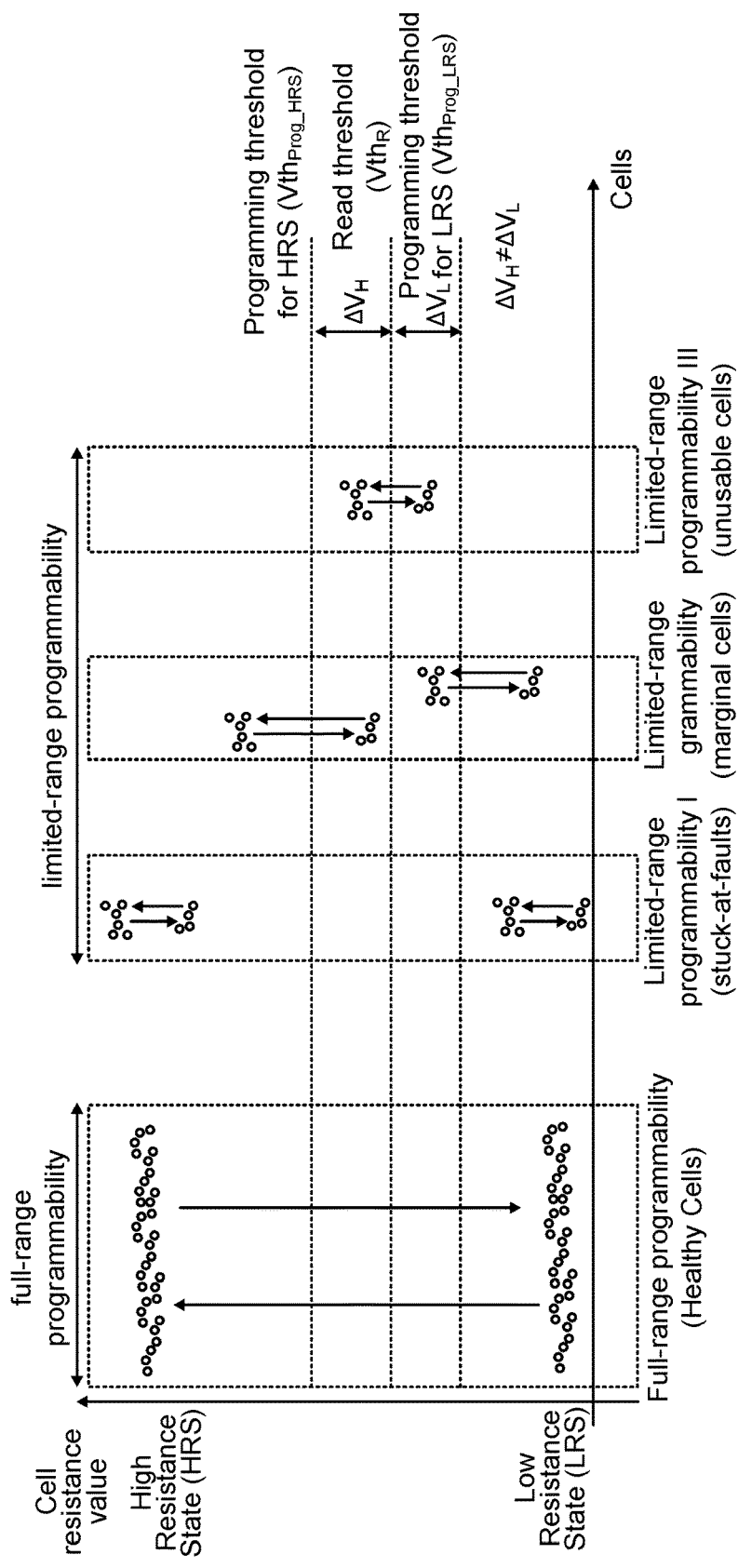
FIG. 6 is a graph illustrating the respective resistance values of NVM cells having full-range programmability (i.e., healthy cells) and NVM cells having limited-range programmability (i.e., damaged cells)
Figure 7:
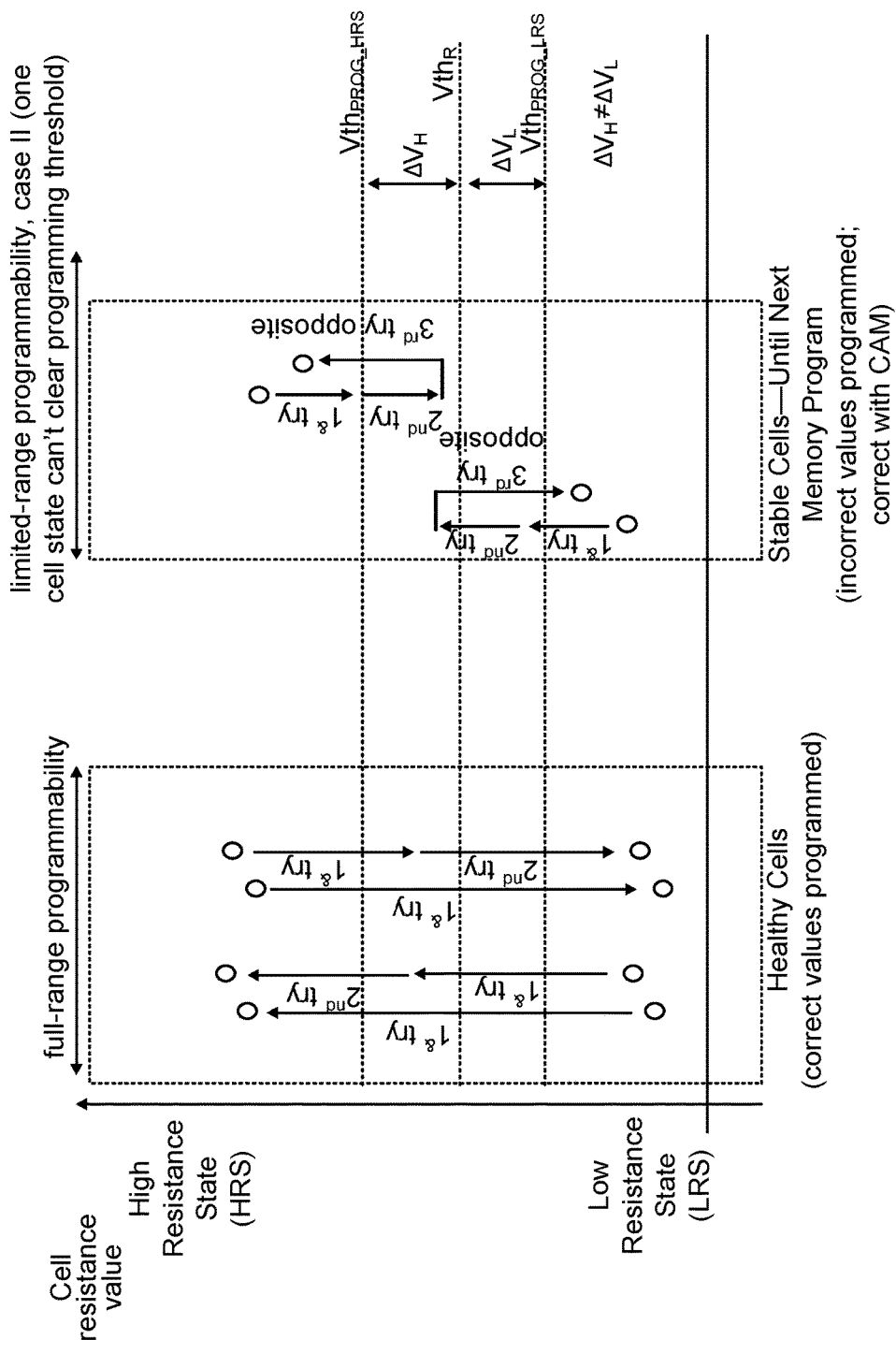
FIG. 7 is a slide illustrating an exemplary programming strategy for the Case II limited-range programmability cells illustrated in FIG. 6 in accordance with aspects disclosed herein.

By way of example, FIG. 6 provides a graph illustrating respective resistance values of exemplary NVM cells having full-range programmability (i.e., healthy cells) and NVM cells having limited-range programmability (e.g., from fabrication variations, from damages accrued with programming cycles, etc.). As illustrated, full-range programmable cells include cells having either a high resistance state (HRS) or a low resistance state (LRS) programmed to values substantially away from threshold voltages, whereas the cell categorizing component 242 may be configured to categorize the limited-range programmable cells of the NVM array as usable cells, marginal cells, or unusable cells. Namely, limited-range programmable cells for this example are grouped into three cases (Case I, Case II, and Case III), as shown. In Case I, cells are usable and closely related to a PCM's stuck-at-faults, wherein cell states are substantially away from the threshold voltages. In Case II, however, only one of the cells is shown as having a state clear from the threshold voltages. This cell may present marginal stability, wherein a special programming strategy may be required to safely use the cell in a state that is adequately away from the threshold voltages. In FIG. 7 an exemplary programming strategy for these Case II limited-range programmability cells is provided, wherein full-range programmable cells are defined as cells that program high beyond $Vth_{PROG\_HRS}$ or program low below $Vth_{PROG\_LRS}$ in at most two tries, and wherein limited-range programmable cells are defined as cells having two unsuccessful program-verify tries and one successful program-verify try in the opposite direction. With respect to Case III, the cells are unusable and closely related to one of the failure modes in filamentary ReRAM, wherein none of the cell states can clear the threshold voltages, and wherein the cells cannot be programmed away from the threshold voltages.

In a further aspect of the disclosure, it is contemplated that the error management system 200 may be configured to provide a low overhead design, while maintaining a fine granularity for write/read operations. In a particular embodiment, the error management system 200 is configured to ascertain a threshold overhead associated with performing a parallel query of the NVM 250 and the CAM 244, and further configured to subsequently select a page size and readout granularity for an array of the NVM based on the threshold overhead. For instance, a page size of 4000 Bytes (4 kB) and a readout granularity of 32 Bytes (32 B) may be used. Indeed, it has been found that utilizing a large data set of multiple 4 kB data pages results in a final overhead of less than 7%, wherein this overhead is not defined by the small 32 B write/read granularity associated with having four data bursts length in a 64-bit memory bus. Also, this particular example assumes an ultimate low latency operation in which the latency of the CAM 244 is hidden behind a data readout latency of the NVM 250, wherein the power dissipation is estimated to be approximately 10 mW for 64-page protection per CAM.

Figure 8:
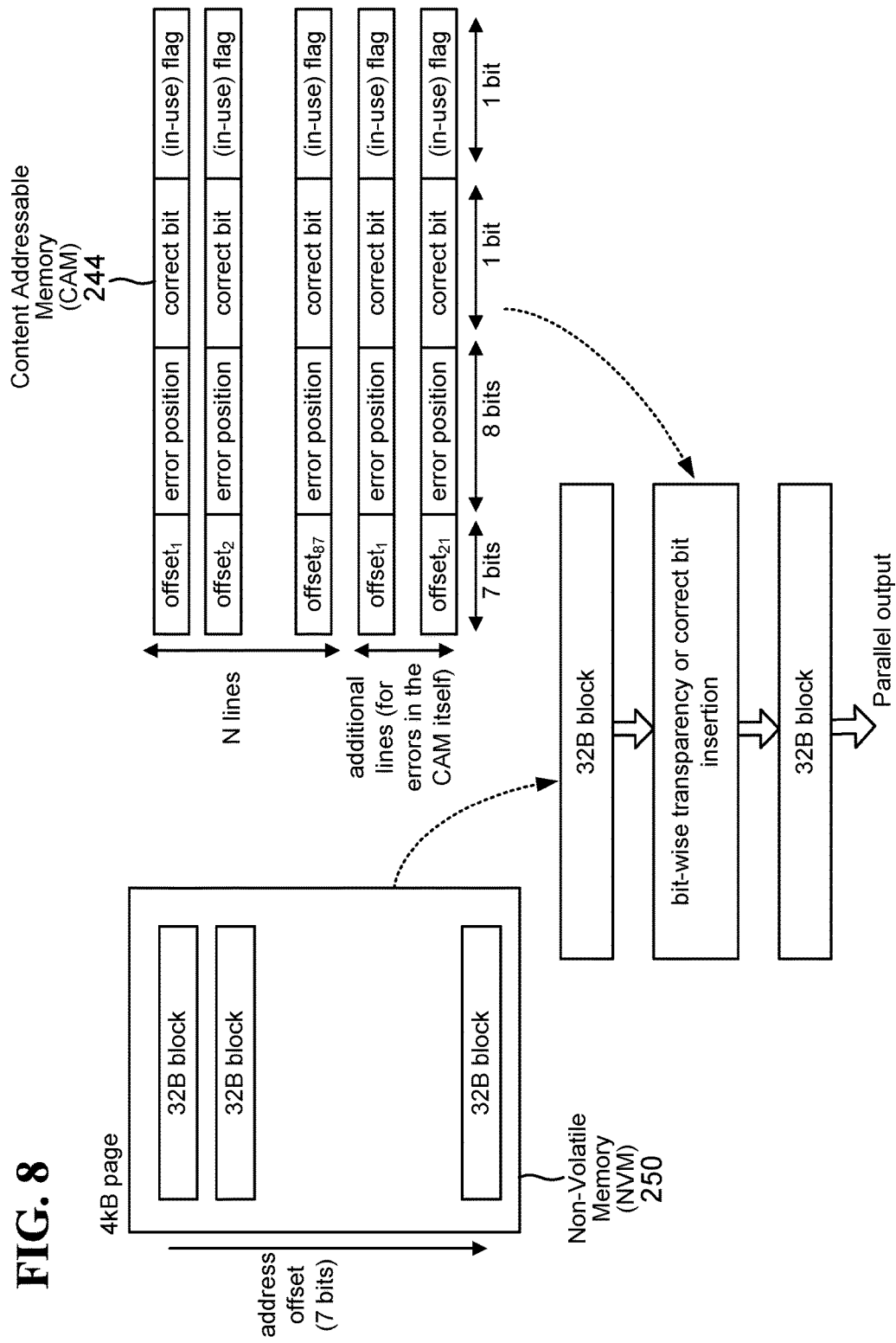
FIG. 8 illustrates an exemplary data readout and parallel content addressable memory (CAM) query for error correction according to an aspect of the subject specification.

Referring next to FIG. 8, an exemplary data readout and parallel CAM query for error management according to aspects disclosed herein is illustrated for a 4 kB page protection case. Within such embodiment, because data from the NVM 250 is read in parallel with ECV data from the CAM 244, latency associated with the CAM 244 is hidden, so long as the CAM 244 latency is smaller than the NVM 250 readout latency. Also, this embodiment assumes 1 bit in error per CAM line, and 1 or more errors per 32 B block. Furthermore, although the write/read granularity is 32 B, the CAM 244 is dedicated to a 4 kB space, rather than any specific 32 B block, which results in low overhead.

As illustrated, the CAM 244 may include a plurality of entries respectively corresponding to ECV information associated with individual errors in the NVM 250. To this end, having the entries include particular details is also contemplated. For instance, each of the plurality of entries may include information corresponding to at least one of an offset, an error position, an error bit, or a usability flag. Within such embodiment, the "offset" may be used to specify an offset into the page at issue and determined by the distance from the start address of a page and the start address of a particular 32 B block as illustrated in FIG. 8; the "error position" may be used to specify the position of the bit in error within the 32 B block, wherein such error position may be encoded in an 8-bit sized field as illustrated in FIG. 8; the "correct bit" may be used to specify the replacement bit for the error position and to indicate the correct bit of information that would have been written in the NVM 250 if the corresponding position in the NVM 250 was not the position of a defective memory cell; and the "usability flag" may be used to specify whether a line of the CAM 244 is already used to report a bit in error or is available to be programmed with the information of a newly discovered bit in error in the 4 kB page. The CAM 244 may also be configured to include entries corresponding to errors associated with the CAM 244 itself, rather than just errors associated with the NVM 250.

Figure 9:
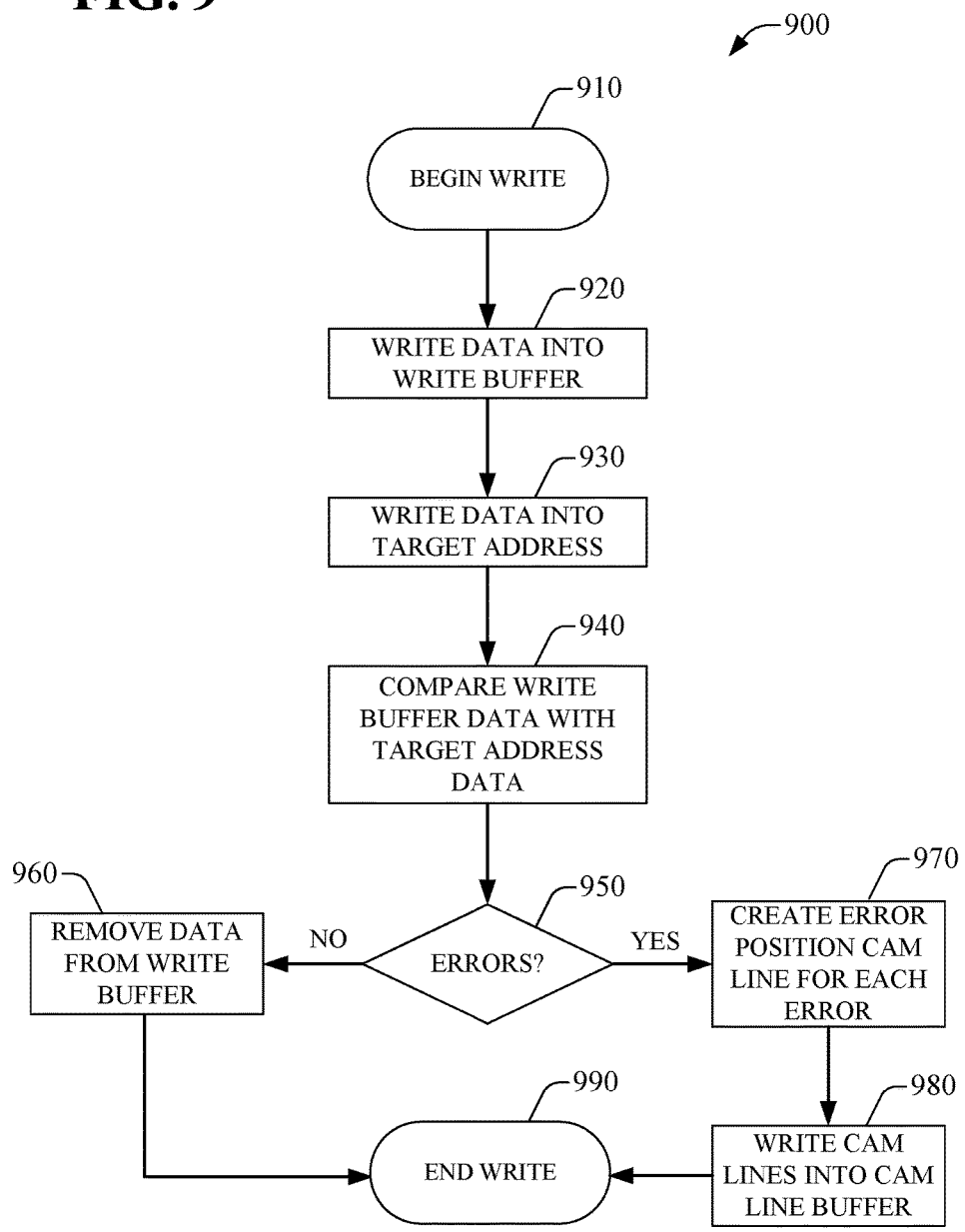
FIG. 9 is a flow chart illustrating aspects of an exemplary write process according to an aspect of the subject specification.

Particular write processes that facilitate a low latency "error free" readout are also contemplated. FIG. 9 is a flow chart illustrating exemplary aspects of such a write process.

As illustrated, process 900 includes a series of acts that may be performed by an NVM system (e.g., error management system 200) according to an aspect of the subject specification. For instance, process 900 may be implemented by employing a processor to execute computer executable instructions stored on a computer readable storage medium to implement the series of acts. In another embodiment, a computer-readable storage medium comprising code for causing at least one computer to implement the acts of process 900 is contemplated.

As illustrated, process 900 begins at act 910 with the commencement of a write procedure, and continues at act 920 where data is written into a write buffer. In a particular embodiment, 32 B of data is written into the write buffer at act 920. Process 900 then proceeds to act 930 where the data written into the write buffer at act 920 is also written into a target address. In parallel with act 930, it should be appreciated that, for each line entry in the CAM 244 with the same offset as the target address (e.g., same offset as the 32 B target address in a 4 kB page), a flag setting may be set to "0" so as to designate that the line is unused.

Once data is written into the write buffer and target address, process 900 continues to act 940 where the data written into the write buffer is compared to the data written into the target address. A determination is then made at act 950 as to whether any errors exist. If errors do not exist, the data in the write buffer is removed at act 960, and process 900 concludes at act 990. If errors indeed exist, however, process 900 proceeds to act 970 where an error position CAM line for each error is created, and where CAM lines are subsequently written into a CAM line buffer at act 980 before process 900 concludes at act 990.

In a particular embodiment of process 900, for each CAM line created, at a turn, that line is written into the first unused line in the CAM 244. The newly written line is then read and compared against a copy of the line in the line buffer. If any errors are found, the line is invalidated in the CAM 244 by writing "0" (i.e., unused) into the line flag. The system then tries to write again in the next unused CAM line. Moreover, the system repeatedly tries to write at another available CAM line, if errors appear. If the system runs out of CAM space, then the write fails, wherein a break occurs and the write fail is logged. If written correctly, however, the CAM line is validated by writing "1" (i.e., used) into the line flag, and the process 900 proceeds to the next CAM error line. This sequence is then repeated until all CAM error lines are written.

Figure 10:
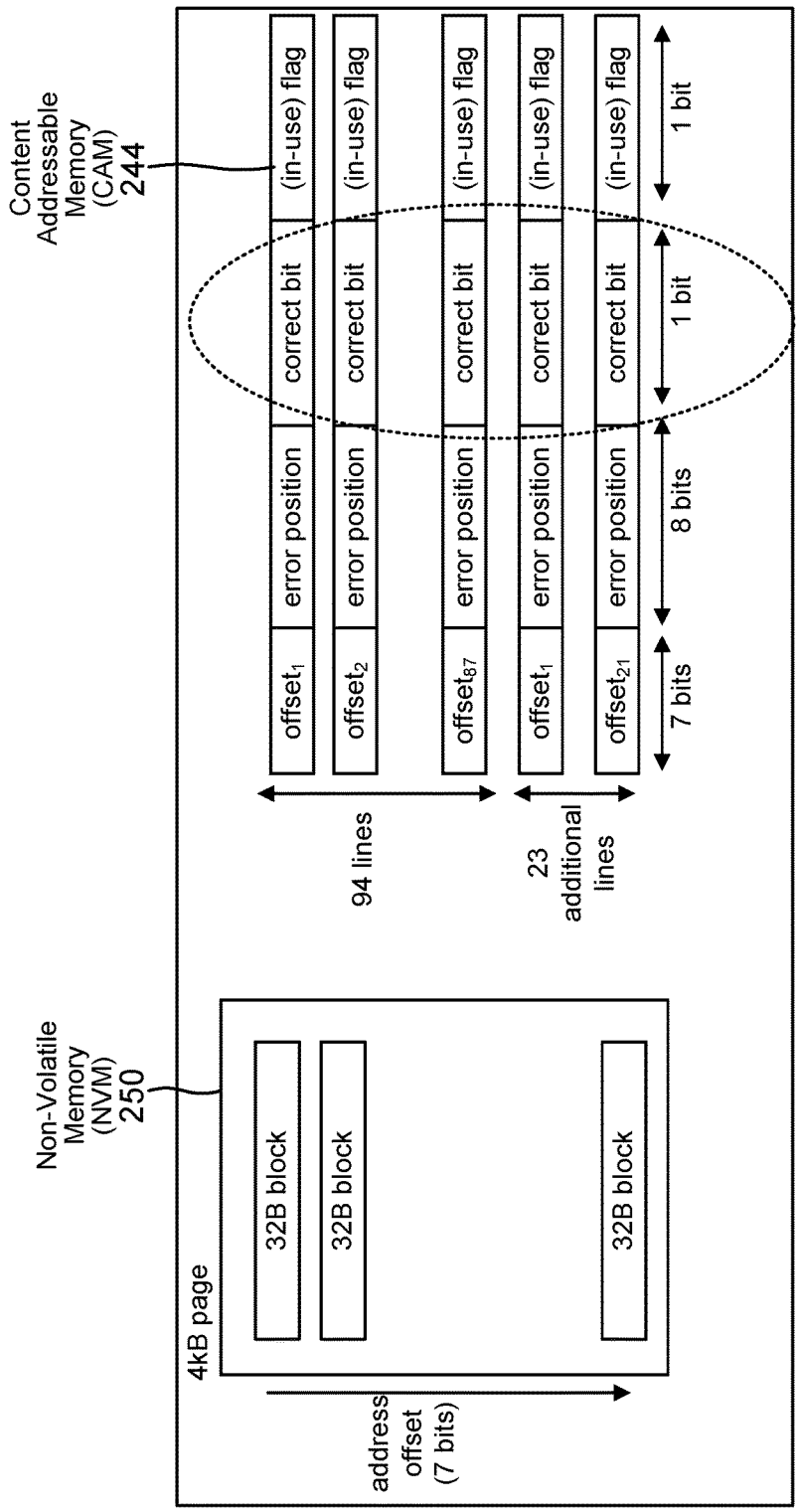
FIG. 10 is an exemplary NVM array and corresponding CAM associated with the write process illustrated in FIG. 9.

Referring next to FIG. 10, an exemplary NVM array and corresponding CAM associated with the process illustrated in FIG. 9 is provided. For this particular example, a data write into the NVM 250 is completed and the existence of bits in error is verified against data in a register. Here, it is contemplated that errors are reported into the CAM 244 lines such that one error is included per CAM 244 line. It is further contemplated that the CAM 244 may have additional lines, and that each bit in error is reported in a line wherever there is an unused available line. It is further contemplated that a write fail in committing an error line into the CAM 244 space will halt the write procedure, wherein the write operation failure is subsequently reported.

Figure 11:
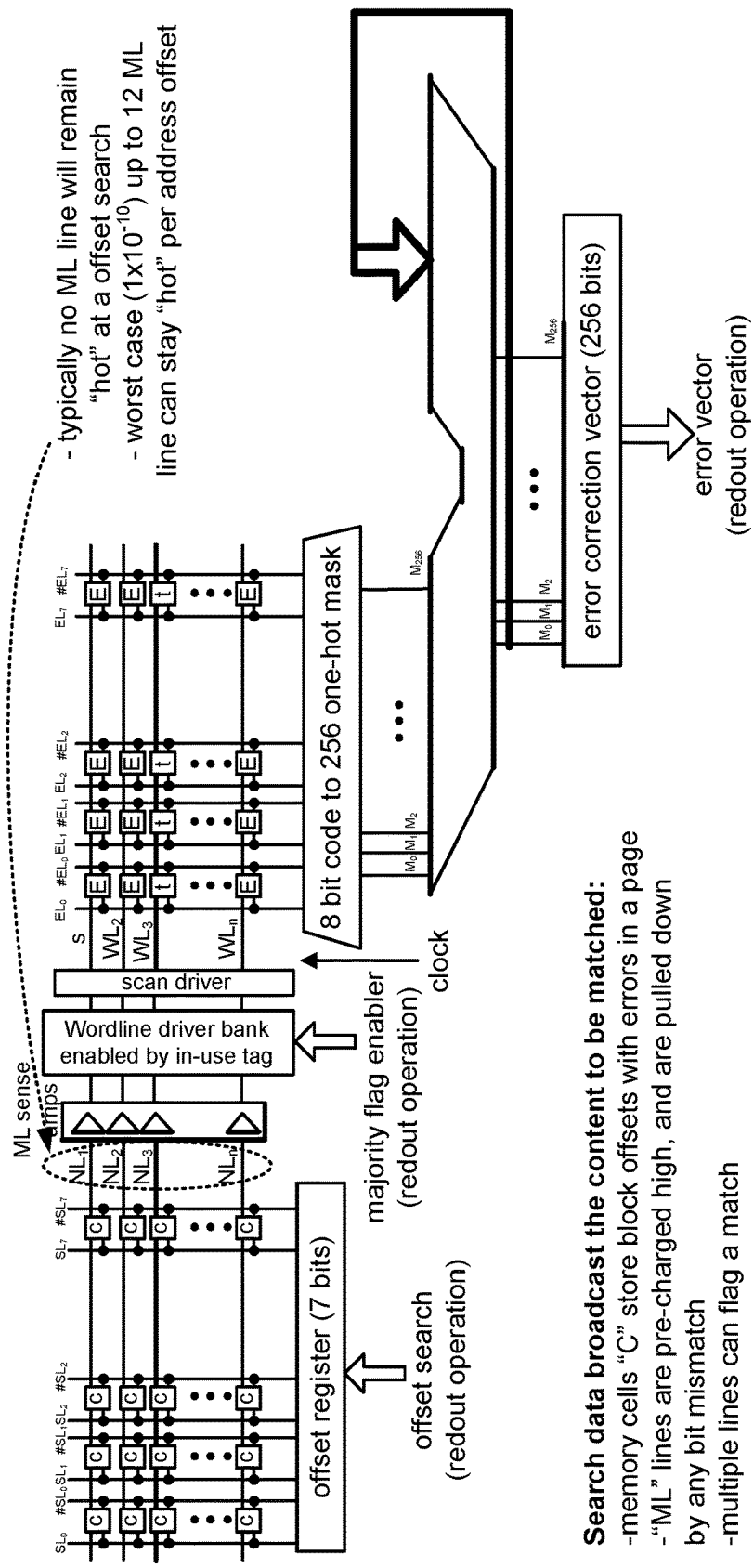
FIG. 11 is a schematic of an exemplary CAM design in accordance with aspects disclosed herein.

Referring next to FIG. 11, a schematic of an exemplary CAM design in accordance with aspects disclosed herein is provided. Within such embodiment, it is contemplated that search data broadcasts the content to be matched, wherein: 1) memory cells "C" store block offsets with errors in a page; 2) ML lines are pre-charged high, and are pulled down by any bit mismatch; and 3) multiple lines can flag a match.

Additional aspects for the disclosed CAM design are also contemplated. For instance, it is contemplated that: 1) CAM cells can be implemented using NVM cells; 2) CAM designs may be implemented as a hybrid NVM-SRAM design, as well as NVM controller chip (SoC) designs; and 3) CAM functionality can be integrated into either NVM chip.

Figure 12:
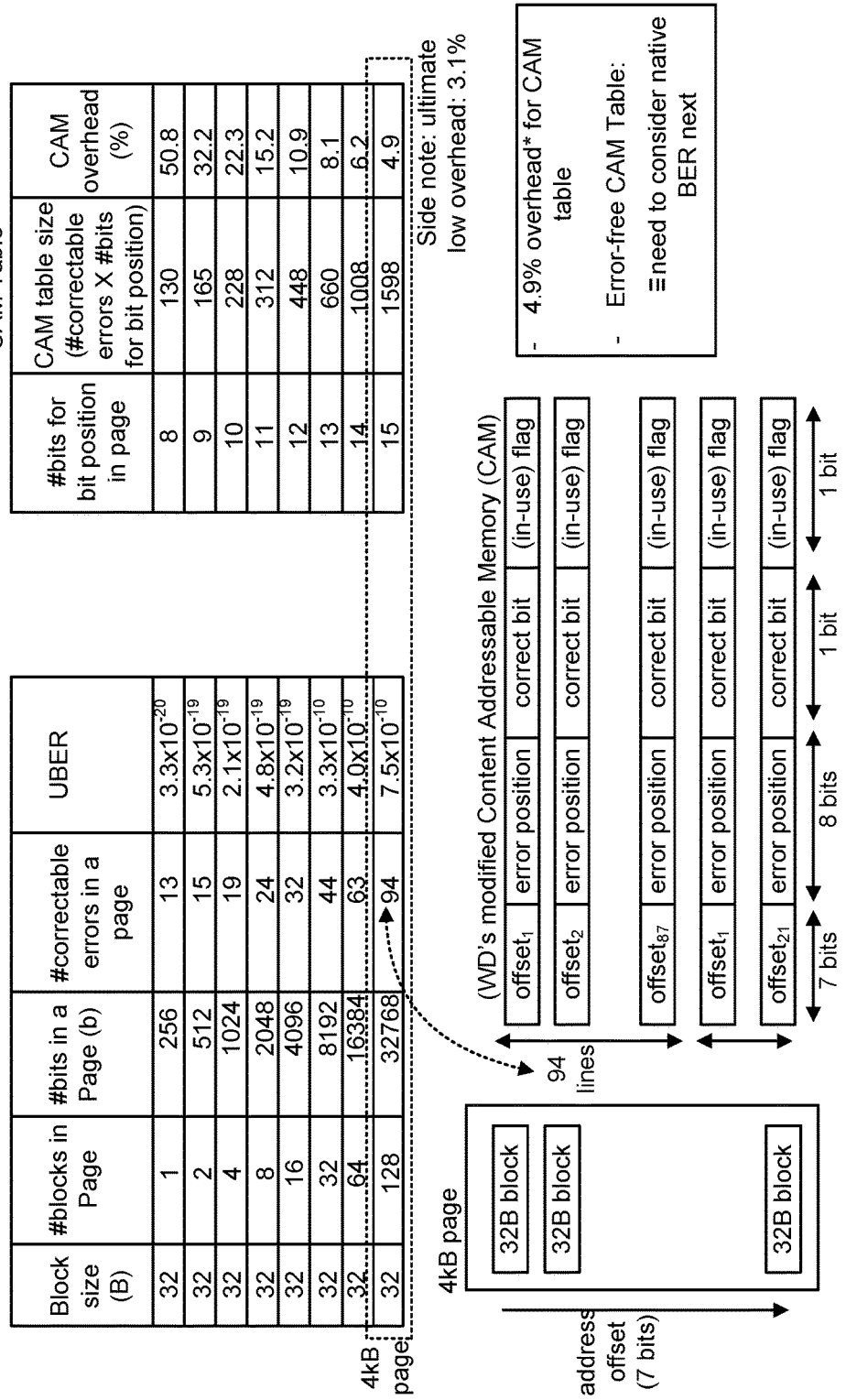
FIG. 12 is a first slide associated with sizing an error correction in accordance with aspects disclosed herein.
Figure 13:
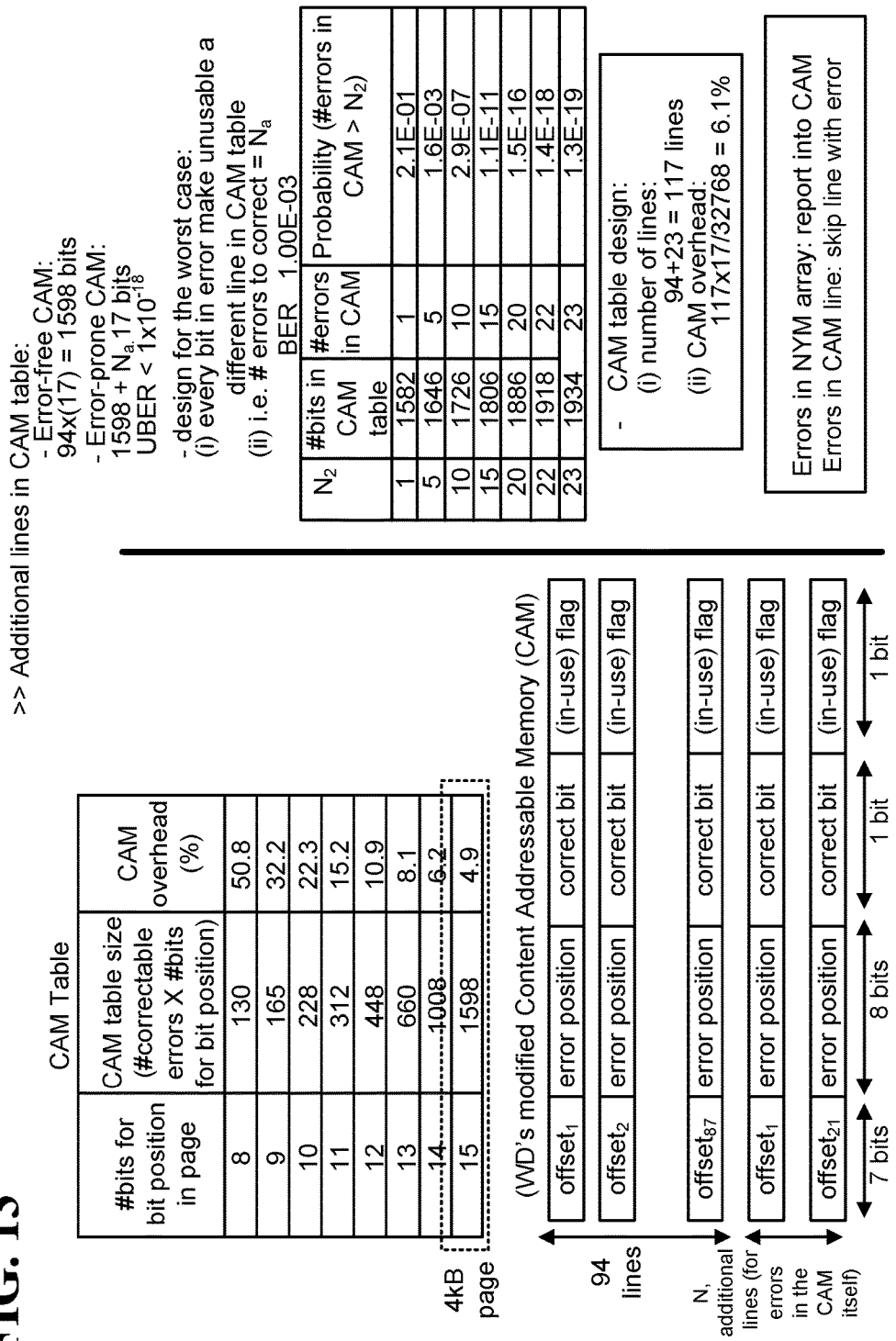
FIG. 13 is a second slide associated with sizing an error correction in accordance with aspects disclosed herein.
Figure 14:
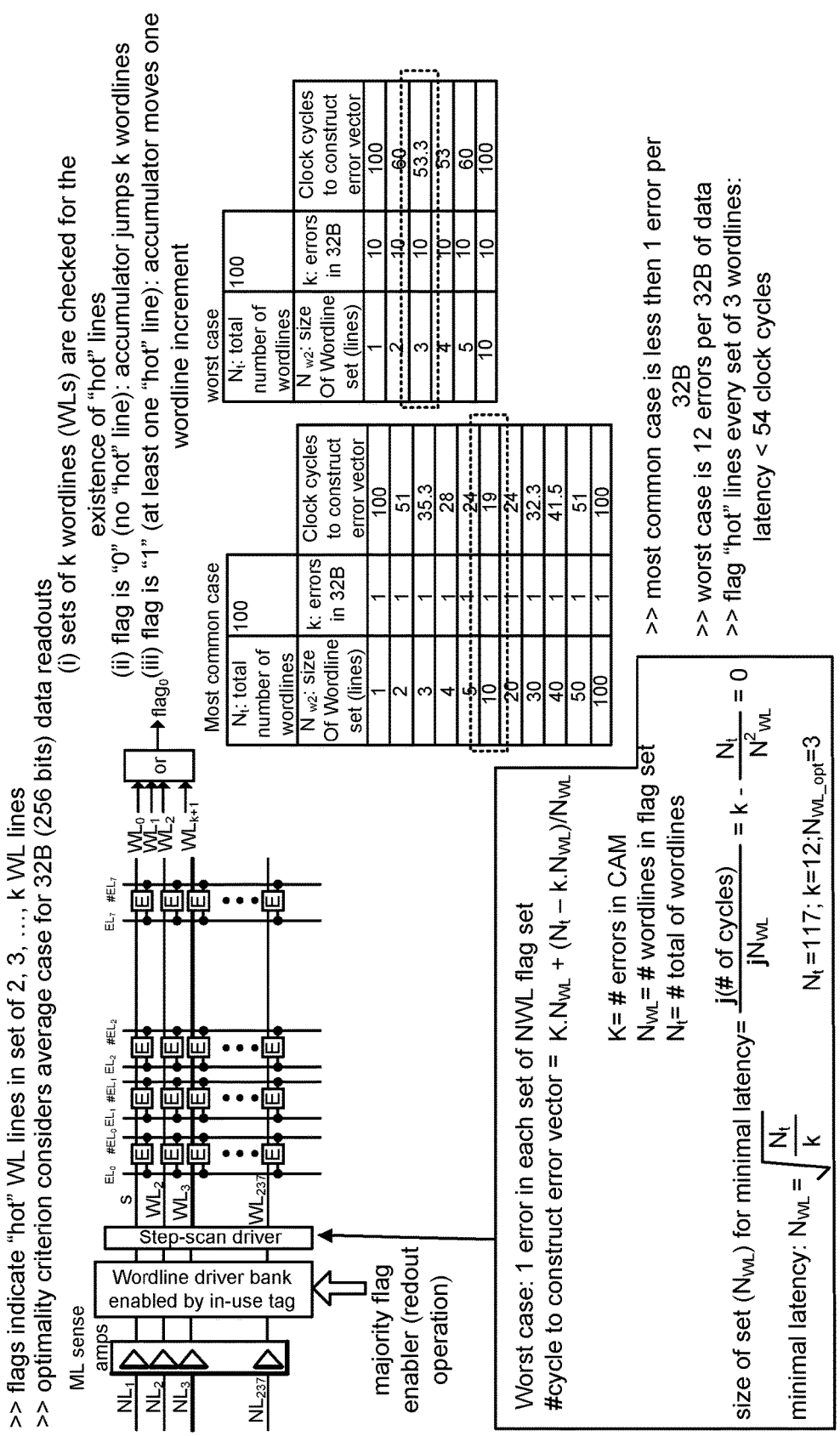
FIG. 14 is a third slide associated with sizing an error correction in accordance with aspects disclosed herein.

Referring next to FIGS. 12-14, various slides associated with sizing an error correction so as to yield a low final overhead in accordance with aspects disclosed herein are provided. Namely, FIG. 12 is a slide illustrating a 4 kB protection with 32 B readout granularity; FIG. 13 is a slide illustrating a protection of errors in the CAM itself; and FIG. 14 is a slide illustrating a CAM alternative that demonstrates step-scan benefits.

Figure 15:
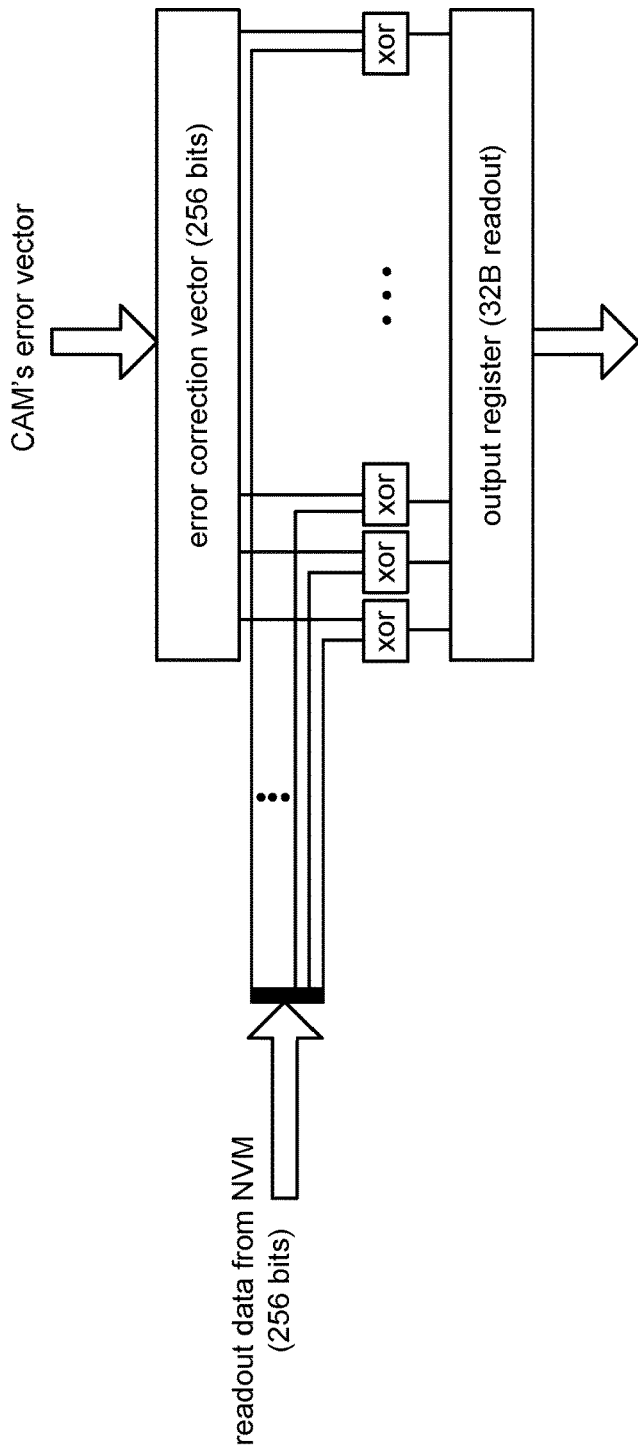
FIG. 15 is a slide illustrating an exemplary CAM design embodiment that supports parallel operation in data readout in accordance with aspects disclosed herein.
Figure 16:
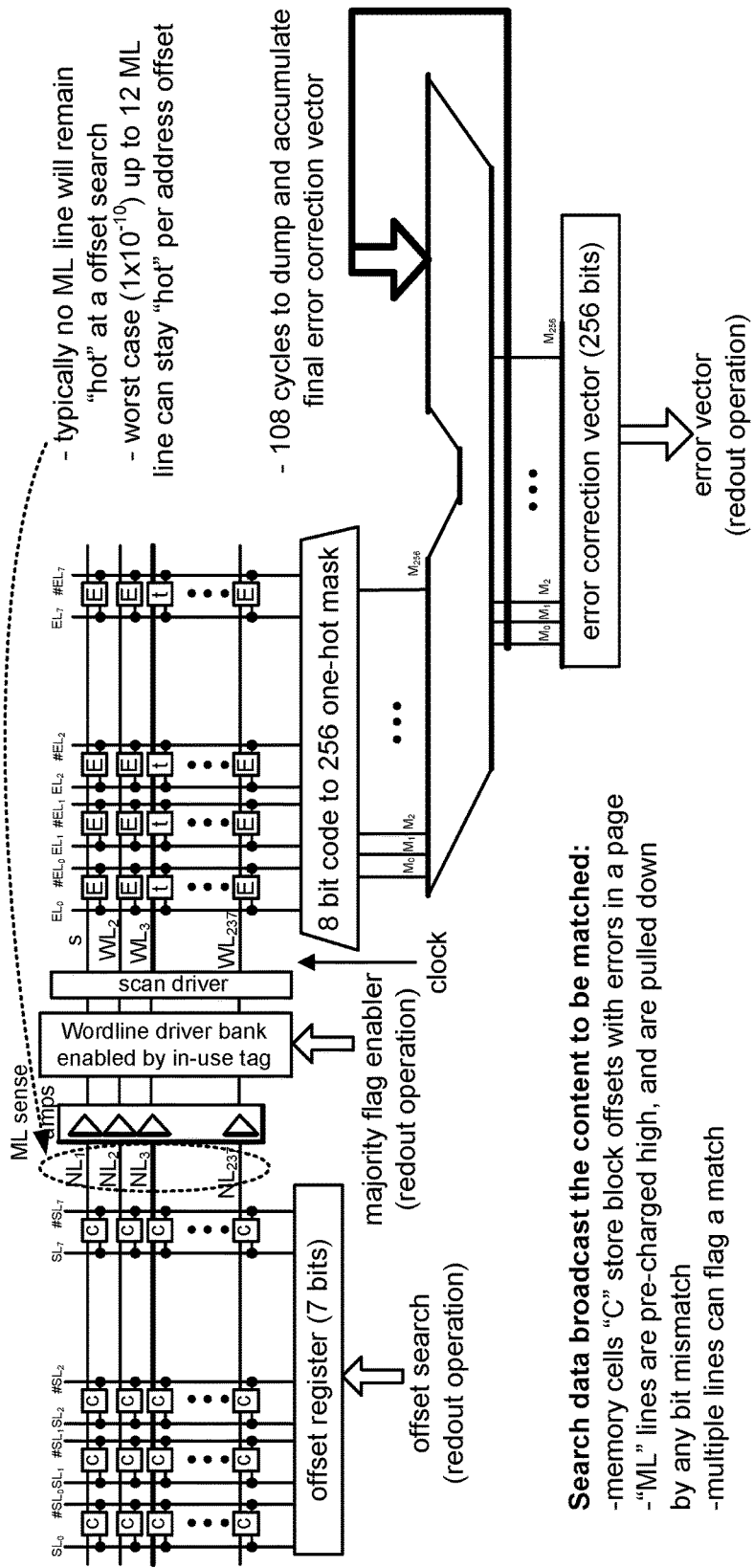
FIG. 16 is a slide illustrating an exemplary first alternative CAM design embodiment which has a minimal area impact and includes a compressed error vector in accordance with aspects disclosed herein.
Figure 17:
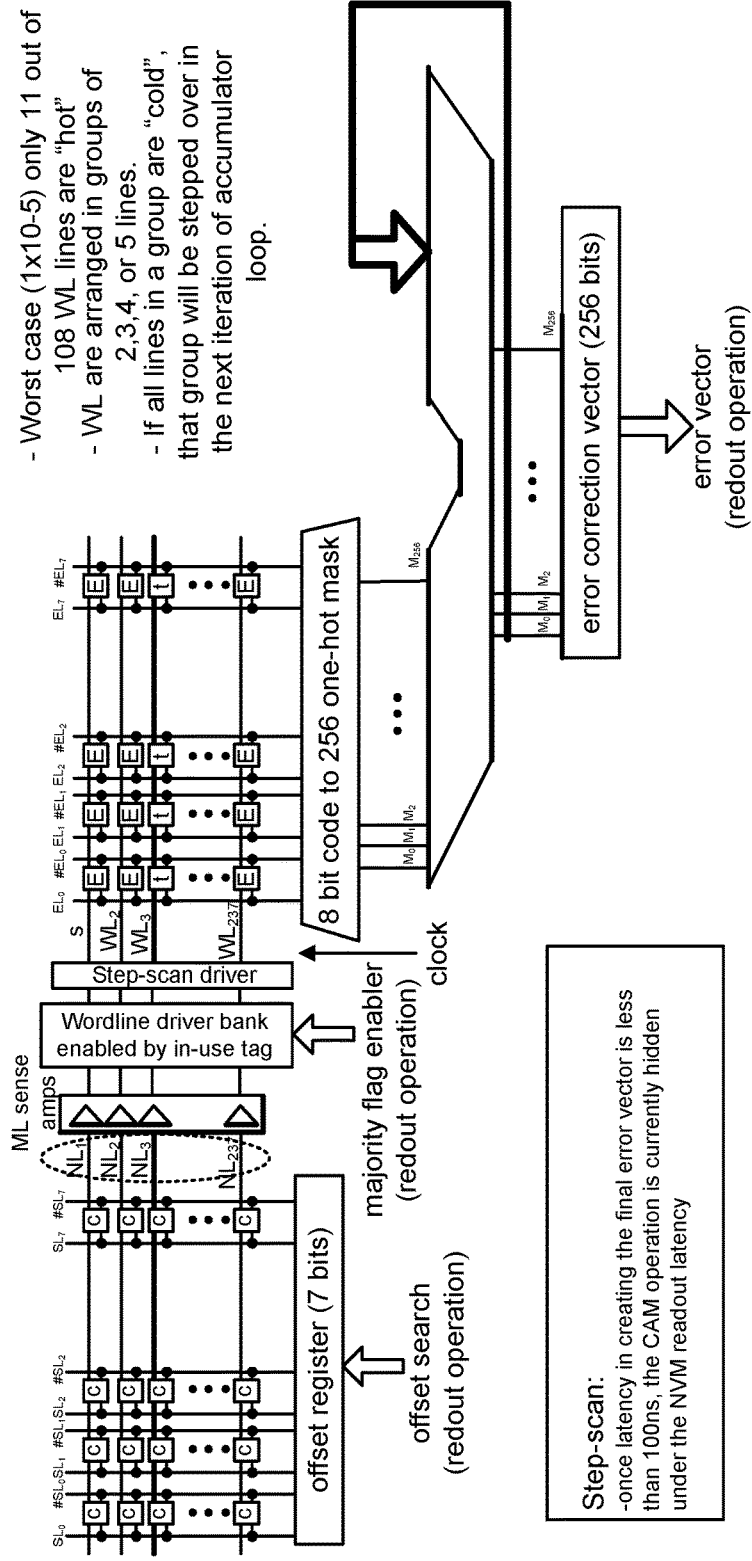
FIG. 17 is a slide illustrating an exemplary second alternative CAM design embodiment which has a minimal area impact and includes a step-scan driver in accordance with aspects disclosed herein.
Figure 18:
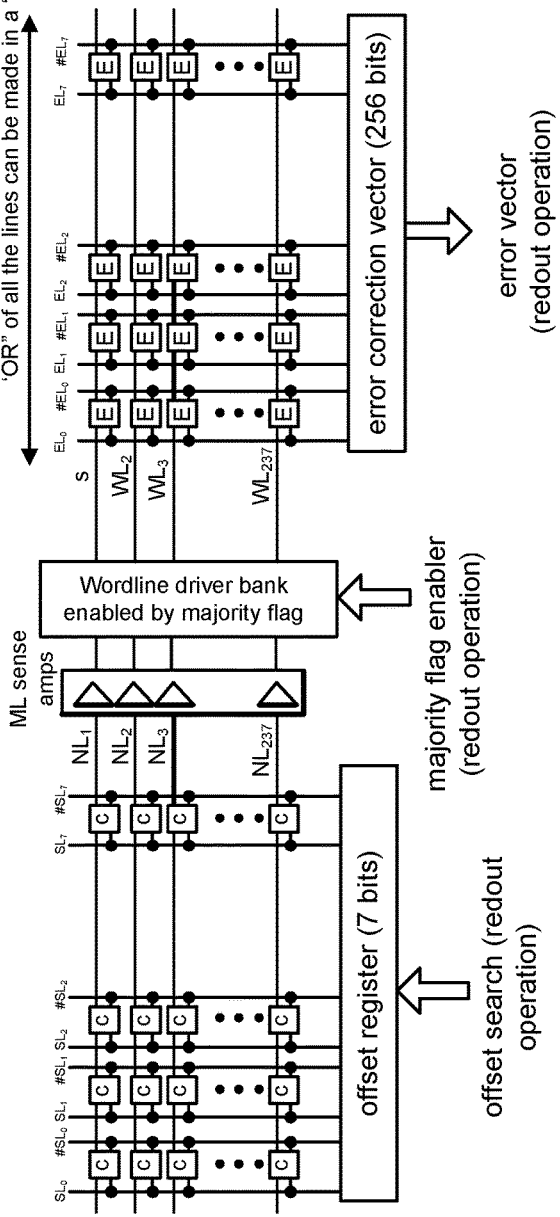
FIG. 18 is a slide illustrating an exemplary third alternative CAM design embodiment which is directed towards achieving a 3 ns latency in accordance with aspects disclosed herein.

Referring next to FIG. 15, an exemplary CAM design that supports parallel operation in data readout is provided. However, any of various alternative CAM designs are also contemplated. For instance, FIG. 16 illustrates a first alternative CAM design embodiment which has a minimal area impact and includes a compressed error vector in the "E" array; FIG. 17 illustrates a second alternative CAM design embodiment which has a minimal area impact and includes a step-scan driver; and FIG. 18 illustrates a third alternative CAM design embodiment which is directed towards achieving a 3 nanosecond (ns) latency.

Figure 19:
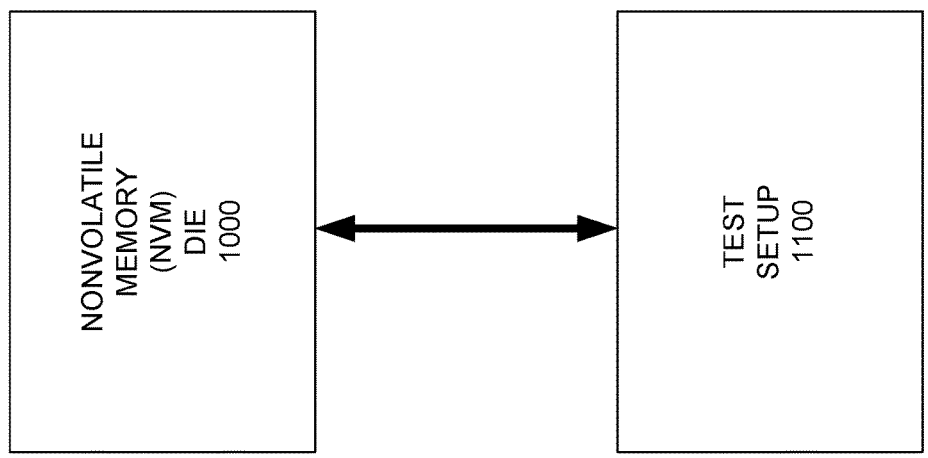
FIG. 19 illustrates a first exemplary embodiment for testing and development in accordance with aspects disclosed herein.

Referring next to FIGS. 19-22, alternative embodiments for testing and development of the aspects disclosed herein are provided. In FIG. 19, for instance, an NVM die 1000 is coupled to a test setup 1100, as illustrated. Within such embodiment, the NVM die 1000 may be configured to include only memory cells for full characterization, and the test setup 1100 may be configured to execute CAM-functionality software.

Figure 20:
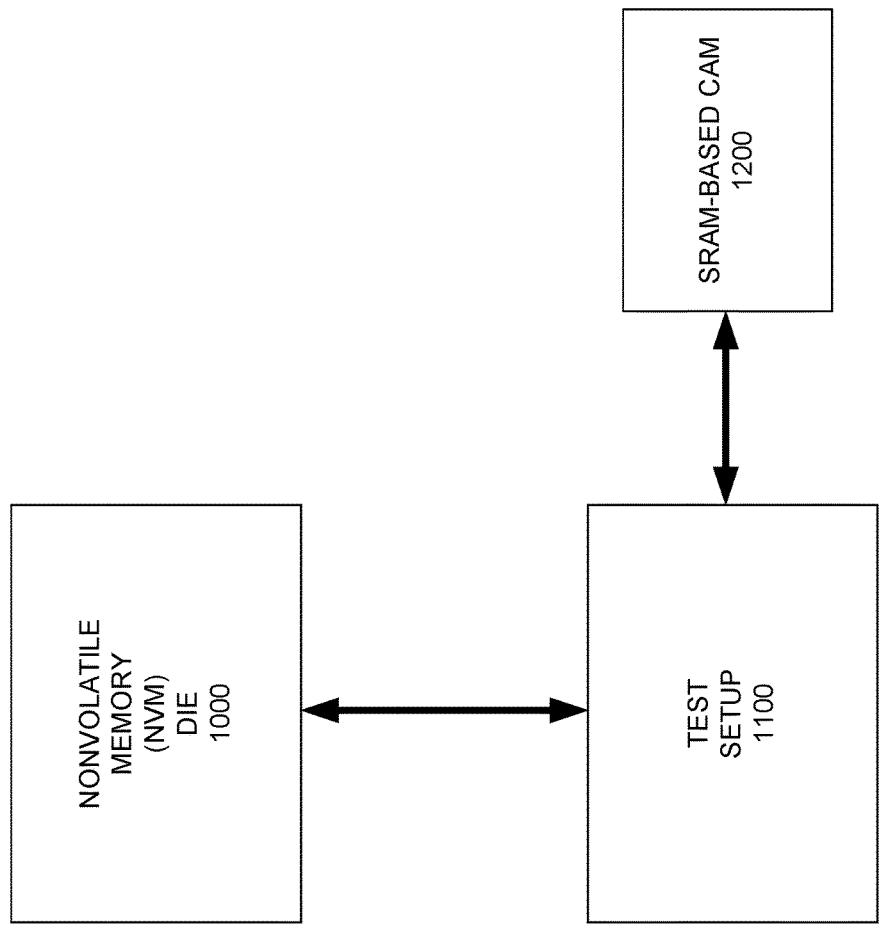
FIG. 20 illustrates a second exemplary embodiment for testing and development in accordance with aspects disclosed herein.

In FIG. 20, however, rather than CAM-functionality software, an embodiment is provided in which an SRAM-based CAM 1200 is coupled to the test setup 1100, as shown. Moreover, for this embodiment, the SRAM-based CAM 1200 is used by the test setup 1100 in parallel with the NVM die 1000. This embodiment may also be further configured to guard against power failure which would erase information about the number of bit errors and result in no error correction capability for the NVM die 1000.

Figure 21:
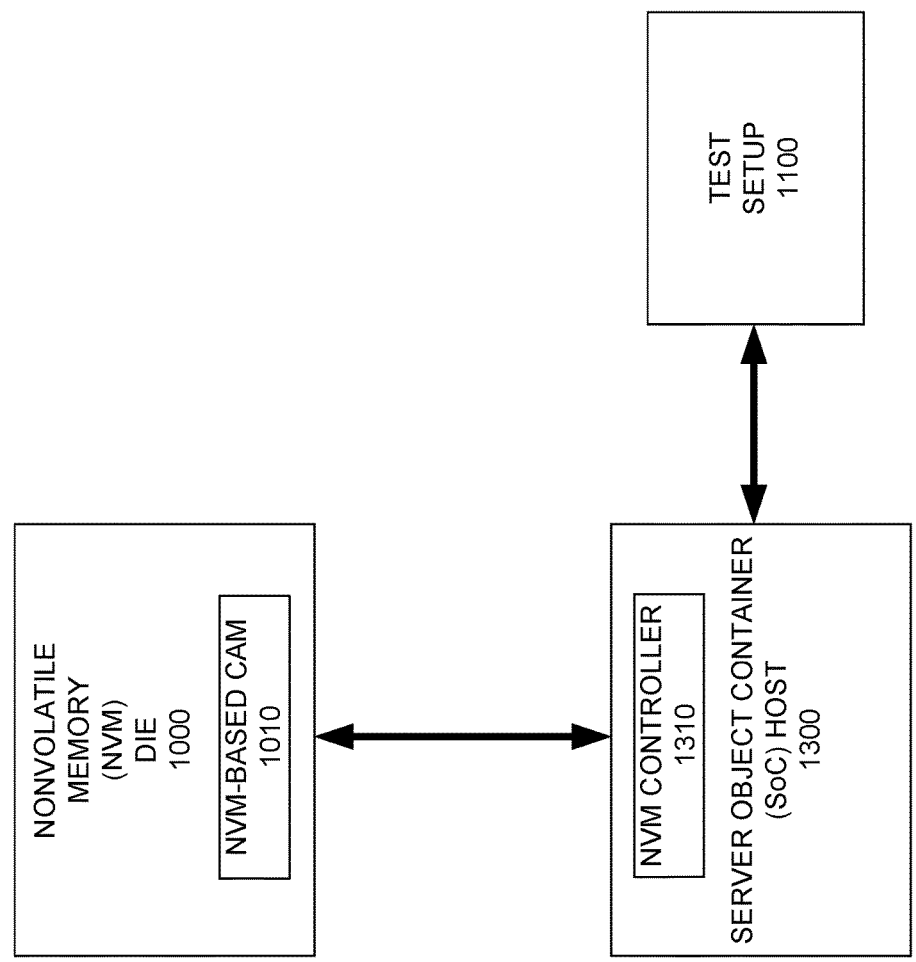
FIG. 21 illustrates a third exemplary embodiment for testing and development in accordance with aspects disclosed herein.

Embodiments that include a server object container (SoC) host are also contemplated. In FIG. 21, for instance, the NVM die 1000 is coupled to an SoC host 1300, as shown, wherein the NVM die 1000 includes an NVM-based CAM 1010, and wherein the SoC host 1300 includes an NVM controller 1310. Such a design allows for permanence, wherein both data content and ECV information are protected from power failures.

Figure 22:
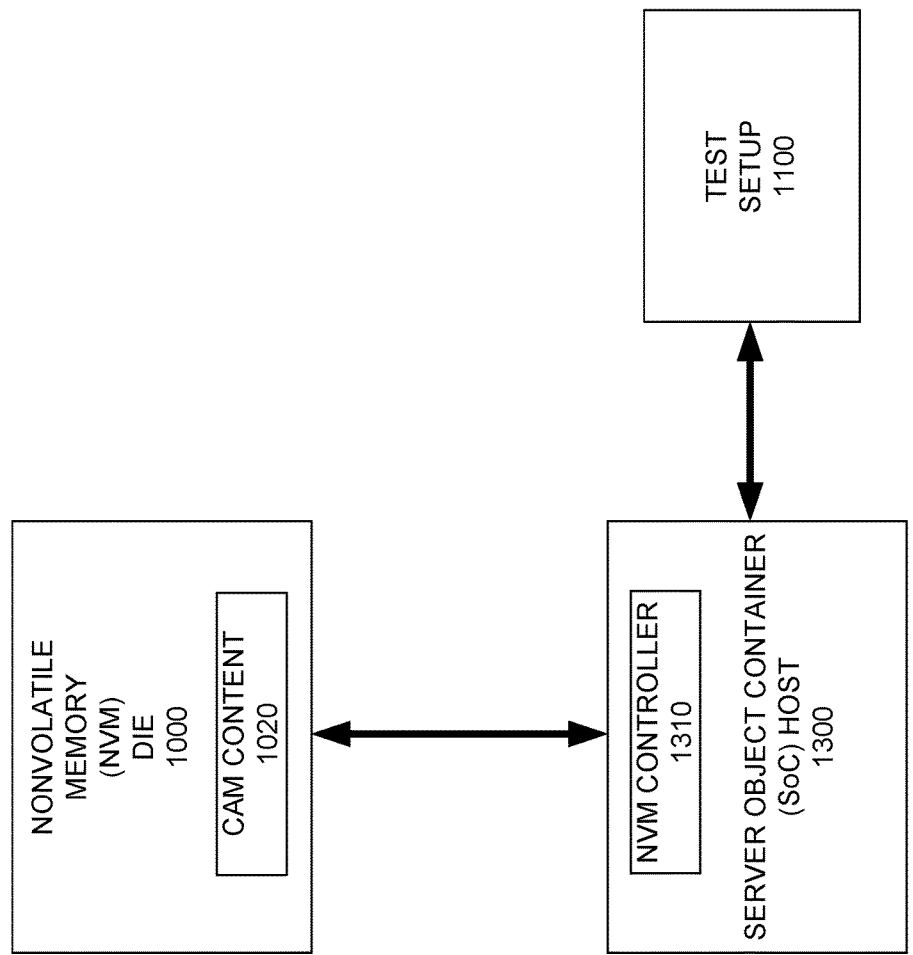
FIG. 22 illustrates a fourth exemplary embodiment for testing and development in accordance with aspects disclosed herein.

Referring next to FIG. 22, another SoC host 1300 embodiment is provided, wherein only the CAM content 1020 is saved in the NVM die 1000. For this embodiment, no CAM functionality if provided in the NVM die 1000. Also, in case of power failure, the system may recover by loading the CAM content 1020 saved in the NVM die 1000 into an SRAM-based CAM, for instance, which allows the system to then resume operation.

The word "exemplary" is used herein to mean serving as an example, instance, or illustration. For the avoidance of doubt, the subject matter disclosed herein is not limited by such examples. In addition, any aspect or design described herein as "exemplary" is not necessarily to be construed as preferred or advantageous over other aspects or designs, nor is it meant to preclude equivalent exemplary structures and techniques known to those of ordinary skill in the art. Furthermore, to the extent that the terms "includes," "has," "contains," and other similar words are used in either the detailed description or the claims, for the avoidance of doubt, such terms are intended to be inclusive in a manner similar to the term "comprising" as an open transition word without precluding any additional or other elements.

The various techniques described herein may be implemented in connection with hardware or software or, where appropriate, with a combination of both. As used herein, the terms "component," "system" and the like are likewise intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on computer and the computer can be a component. One or more components may reside within a process and/or thread of execution and a component may be localized on one computer and/or distributed between two or more computers.

The aforementioned systems have been described with respect to interaction between several components. It can be appreciated that such systems and components can include those components or specified sub-components, some of the specified components or sub-components, and/or additional components, and according to various permutations and combinations of the foregoing. Sub-components can also be implemented as components communicatively coupled to other components rather than included within parent components (hierarchical). Additionally, it is noted that one or more components may be combined into a single component providing aggregate functionality or divided into several separate sub-components, and any one or more middle layers, such as a management layer, may be provided to communicatively couple to such sub-components in order to provide integrated functionality. Any components described herein may also interact with one or more other components not specifically described herein but generally known by those of skill in the art.

In view of the exemplary systems described supra, methodologies that may be implemented in accordance with the disclosed subject matter can be appreciated with reference to the flowcharts of the various figures. While for purposes of simplicity of explanation, the methodologies are shown and described as a series of blocks, it is to be understood and appreciated that the claimed subject matter is not limited by the order of the blocks, as some blocks may occur in different orders and/or concurrently with other blocks from what is depicted and described herein. Where non-sequential, or branched, flow is illustrated via flowchart, it can be appreciated that various other branches, flow paths, and orders of the blocks, may be implemented which achieve the same or a similar result. Moreover, not all illustrated blocks may be required to implement the methodologies described hereinafter.

While the various embodiments have been described in connection with the preferred embodiments of the various figures, it is to be understood that other similar embodiments may be used or modifications and additions may be made to the described embodiment for performing the same function without deviating there from. Still further, one or more aspects of the above described embodiments may be implemented in or across a plurality of processing chips or devices, and storage may similarly be affected across a plurality of devices. Therefore, the present invention should not be limited to any single embodiment.

What is claimed is:

1. A method, comprising:
employing a processor to execute computer executable instructions stored on a computer readable storage medium to implement the following acts:
storing data in a non-volatile memory (NVM) array;
storing error correction vector (ECV) information associated with the NVM array in a content addressable memory (CAM); and
performing a parallel query of the NVM array and the CAM, wherein the parallel query includes a query of the NVM array that yields a readout of the NVM array and a query of the CAM that yields an ECV corresponding to the readout of the NVM array and wherein the parallel query causes latencies from the readout of the NVM array and latencies associated with a construction of the ECV corresponding to the readout of the NVM array to occur in parallel.

2. The method of claim 1, determining a range of programmability associated with each of a plurality of NVM cells within the NVM array when the plurality of NVM cells are programmed.

3. The method of claim 2, wherein the storing of the ECV information is limited to storing information corresponding to NVM cells identified as limited-range programmable cells.

4. The method of claim 1, wherein the CAM stores a plurality of entries respectively corresponding to the ECV information associated with individual errors in the NVM array.

5. The method of claim 4, wherein each of the plurality of entries includes information corresponding to at least one of an offset, an error position, an error bit, or a usability flag.

6. The method of claim 4, wherein the CAM further includes at least one entry corresponding to an error associated with the CAM.

7. The method of claim 1, further comprising:
ascertaining a threshold overhead associated with performing the parallel query of the NVM array and the CAM; and
selecting a page size and readout granularity for the NVM array based on the threshold overhead.

8. The method of claim 7, wherein the page size is 4000 bytes, and wherein the readout granularity is 32 bytes.

9. A system comprising:
a processing unit comprising at least one processor;
a non-volatile memory (NVM) controlled by the processing unit, the NVM configured to store data in an NVM array;
a content addressable memory (CAM) controlled by the processing unit, the CAM configured to store error correction vector (ECV) information associated with the NVM array; and
a query component controlled by the processing unit, the query component configured to perform a parallel query of the NVM array and the CAM, wherein the parallel query includes a query of the NVM array that yields a readout of the NVM array and a query of the CAM that yields an ECV corresponding to the readout of the NVM array, and wherein the parallel query causes latencies from the readout of the NVM array and latencies associated with a construction of the ECV corresponding to the readout of the NVM array to occur in parallel.

10. The system of claim 9, wherein the processing unit comprises a plurality of processors, and wherein the NVM is a shared NVM controllable by each of the plurality of processors.

11. The system of claim 10, wherein the shared NVM is configured to facilitate a global wear leveling across the plurality of processors.

12. The system of claim 9, wherein the query component is configured to perform the parallel query according to the latencies from the readout of the NVM array and the latencies associated with the construction of the ECV corresponding to the readout of the NVM array.

13. The system of claim 12, wherein the latencies associated with the construction of the ECV is less than the latencies from the readout of the NVM array, and wherein the query component is configured to schedule the parallel query so that the latencies associated with the construction of the ECV ends before the latencies from the readout of the NVM array.

14. The system of claim 9, further comprising a cell categorizing component controlled by the processing unit, wherein the cell categorizing component is configured to determine a range of programmability associated with each of a plurality of NVM cells within the NVM array when the plurality of NVM cells are programmed, and wherein the CAM is configured to limit a storage of the ECV information to information corresponding to NVM cells identified as limited-range programmable cells.

15. The system of claim 14, wherein the cell categorizing component is configured to determine the range of programmability based on a first threshold voltage associated with programming a cell into a high resistance state and on a second threshold voltage associated with programming a cell into a low resistance state.

16. The system of claim 14, wherein the cell categorizing component is configured to categorize the limited-range programmable cells of the NVM array as usable cells, marginal cells, or unusable cells.

17. An apparatus, comprising:
means for storing data in a non-volatile memory (NVM) array;
means for storing error correction vector (ECV) information associated with the NVM array in a content addressable memory (CAM); and
means for performing a parallel query of the NVM array and the CAM, wherein the parallel query includes a query of the NVM array that yields a readout of the NVM array and a query of the CAM that yields an ECV corresponding to the readout of the NVM array, and wherein the parallel query causes latencies from the readout of the NVM array and latencies associated with a construction of the ECV corresponding to the readout of the NVM array to occur in parallel.

18. The apparatus of claim 17, wherein the CAM is configured according to a compressed error vector configuration.

19. The apparatus of claim 17, wherein the CAM is configured according to a step scan driver configuration.

20. The apparatus of claim 17, wherein the CAM is configured according to a single shot configuration.

* * * * *